United States Patent
Lee et al.

(10) Patent No.: US 10,811,595 B2
(45) Date of Patent: Oct. 20, 2020

(54) TECHNIQUES FOR FORMING LOGIC INCLUDING INTEGRATED SPIN-TRANSFER TORQUE MAGNETORESISTIVE RANDOM-ACCESS MEMORY

(71) Applicant: INTEL CORPORATION, Santa Clara, CA (US)

(72) Inventors: Kevin J. Lee, Beaverton, OR (US); Oleg Golonzka, Beaverton, OR (US); Tahir Ghani, Portland, OR (US); Ruth A. Brain, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/073,687

(22) PCT Filed: Apr. 1, 2016

(86) PCT No.: PCT/US2016/025585
§ 371 (c)(1),
(2) Date: Jul. 27, 2018

(87) PCT Pub. No.: WO2017/171840
PCT Pub. Date: Oct. 5, 2017

(65) Prior Publication Data
US 2019/0081233 A1    Mar. 14, 2019

(51) Int. Cl.
*H01L 43/02* (2006.01)
*H01L 27/22* (2006.01)
(Continued)

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01); *H01L 43/14* (2013.01)

(58) Field of Classification Search
CPC ......... H01L 43/02; H01L 43/08; H01L 43/10; H01L 43/12; H01L 27/222
See application file for complete search history.

(56) References Cited

U.S. PATENT DOCUMENTS 9,276,195 B2 * 3/2016 Kanaya ................... H01L 43/02
2009/0130779 A1   5/2009 Li et al.
(Continued)

FOREIGN PATENT DOCUMENTS

WO    2014142956 A1    9/2014
WO    2017155508 A1    9/2017
WO    2017/171840 A1   10/2017

OTHER PUBLICATIONS

International Search Report and Written Opinion received for PCT Application No. PCT/US2016/025585. dated Dec. 27, 2016. 13 pages.
(Continued)

*Primary Examiner* — Sue A Purvis
*Assistant Examiner* — Scott Stowe
(74) *Attorney, Agent, or Firm* — Finch & Maloney PLLC

(57) ABSTRACT

Techniques are disclosed for forming a logic device including integrated spin-transfer torque magnetoresistive random-access memory (STT-MRAM). In accordance with some embodiments, one or more magnetic tunnel junction (MTJ) devices may be formed within a given back-end-of-line (BEOL) interconnect layer of a host logic device. A given MTJ device may be formed, in accordance with some embodiments, over an electrically conductive layer configured to serve as a pedestal layer for the MTJ's constituent magnetic and insulator layers. In accordance with some embodiments, one or more conformal spacer layers may be formed over sidewalls of a given MTJ device and attendant pedestal layer, providing protection from oxidation and corrosion. A given MTJ device may be electrically coupled
(Continued)

with an underlying interconnect or other electrically conductive feature, for example, by another intervening electrically conductive layer configured to serve as a thin via, in accordance with some embodiments.

21 Claims, 14 Drawing Sheets

(51) Int. Cl.
  *H01L 43/12* (2006.01)
  *H01L 43/08* (2006.01)
  *H01L 43/10* (2006.01)
  *H01L 43/14* (2006.01)

(56) References Cited

U.S. PATENT DOCUMENTS

| | | |
|---|---|---|
| 2010/0109106 A1 | 5/2010 | Zhong et al. |
| 2010/0221848 A1 | 9/2010 | Keshtbod et al. |
| 2012/0228728 A1* | 9/2012 | Ueki ...................... H01L 43/08 |
| | | 257/421 |
| 2014/0015078 A1 | 1/2014 | Huai et al. |
| 2014/0077318 A1 | 3/2014 | Kula et al. |
| 2015/0263267 A1* | 9/2015 | Kanaya ............... H01L 21/3213 |
| | | 257/421 |
| 2015/0372225 A1 | 12/2015 | Gaidis et al. |
| 2016/0020383 A1 | 1/2016 | Kang et al. |
| 2016/0093668 A1 | 3/2016 | Lu et al. |
| 2017/0170386 A1* | 6/2017 | Chuang ................. H01L 27/228 |
| 2017/0194557 A1* | 7/2017 | Chuang .................. H01L 43/02 |

OTHER PUBLICATIONS

International Preliminary Report on Patentability received for PCT Application No. PCT/US2016/025585. dated Oct. 2, 2018. 11 pages.

Extended European Search Report received for EP Application No. 16897380.8, dated Oct. 24, 2019. 7 pages.

* cited by examiner

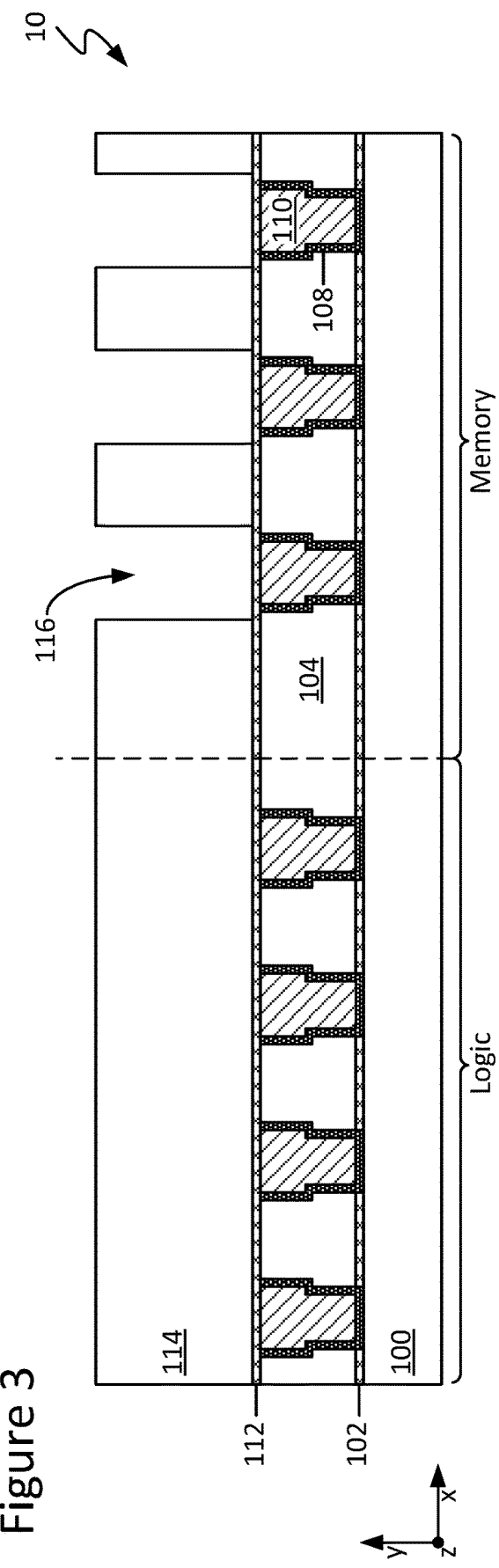
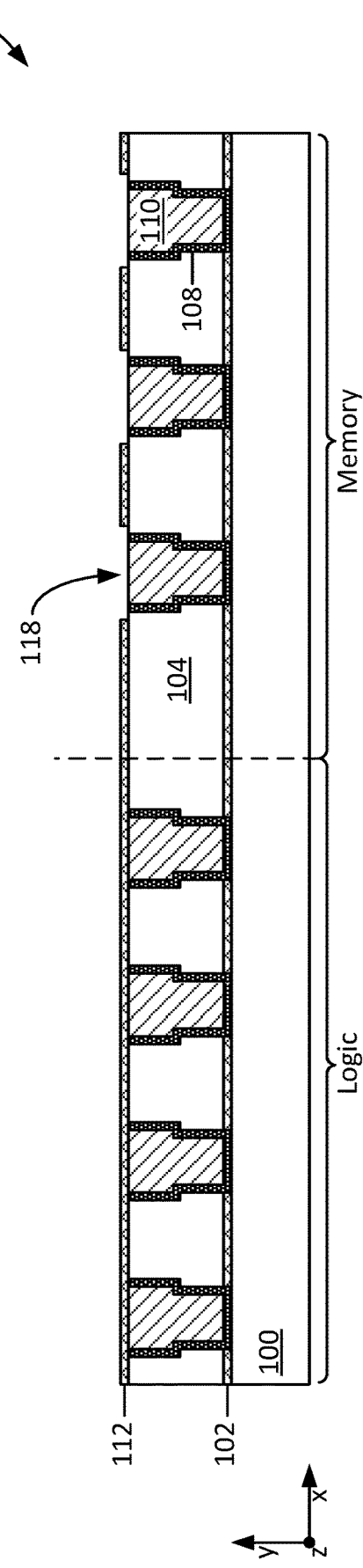

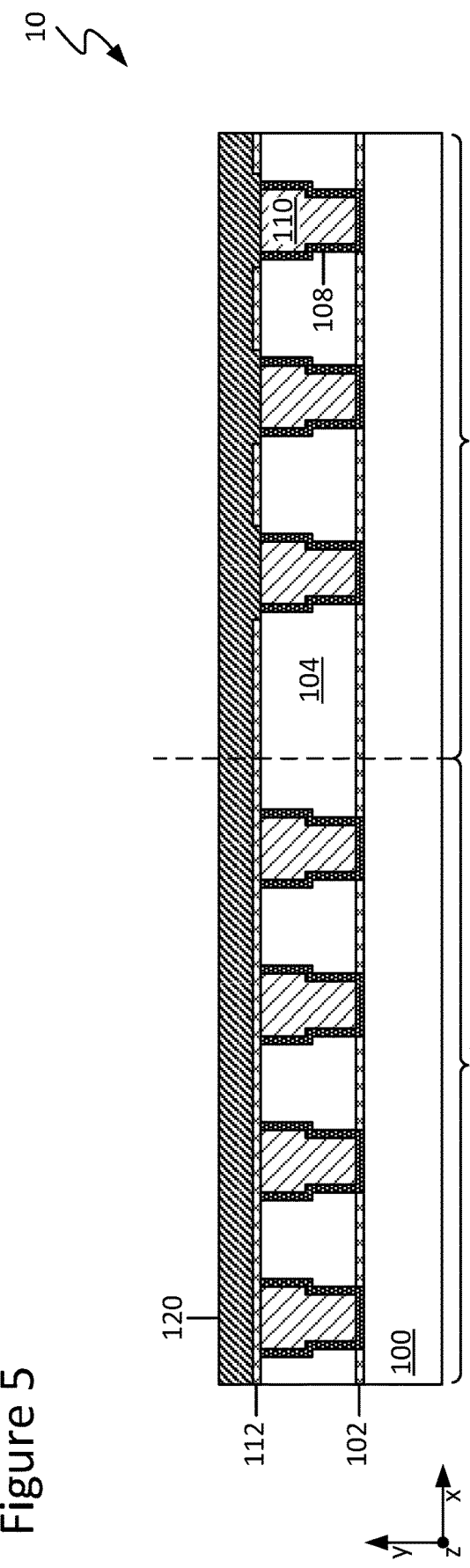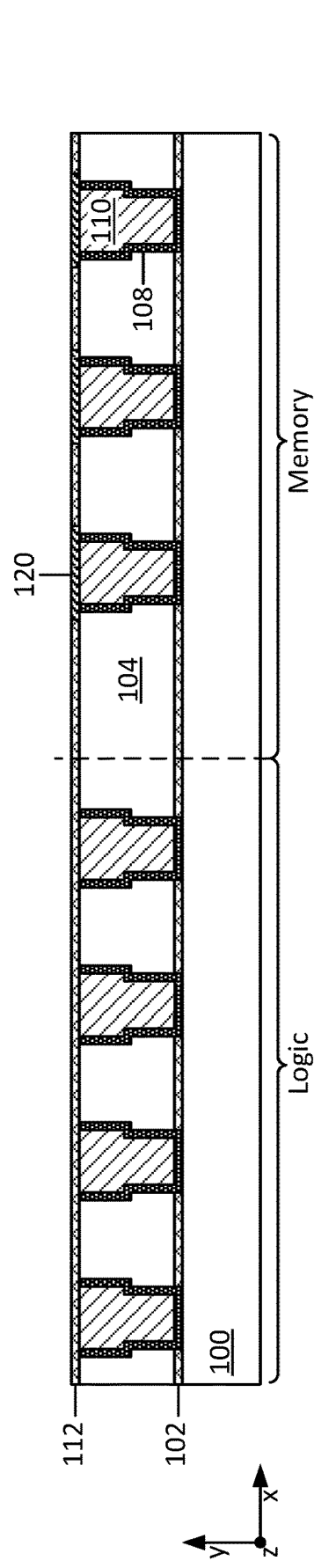

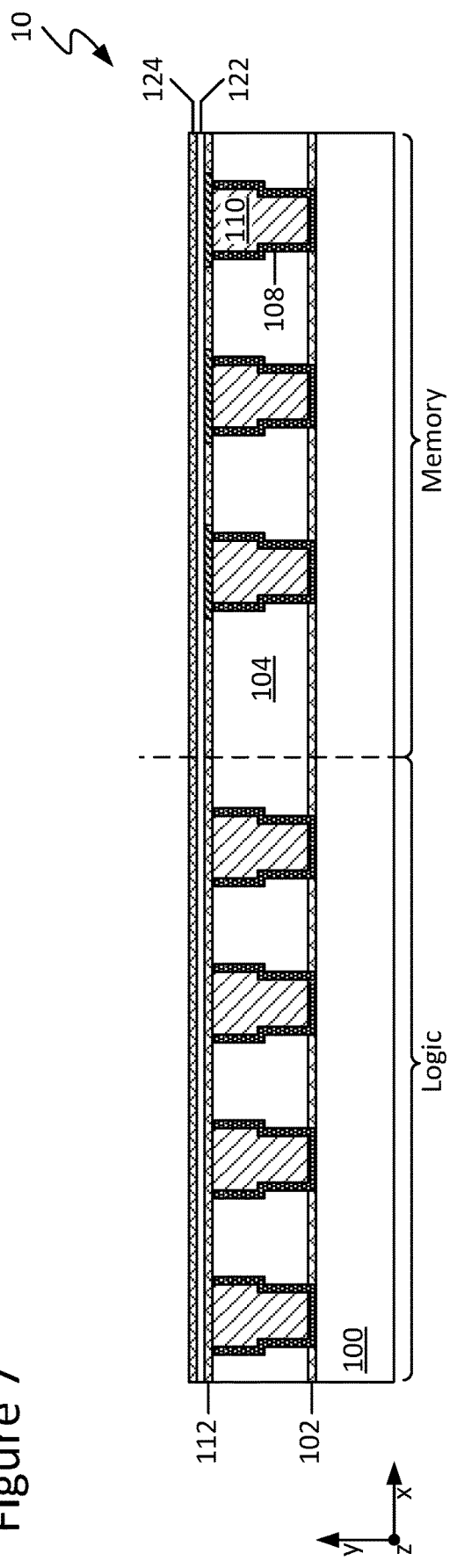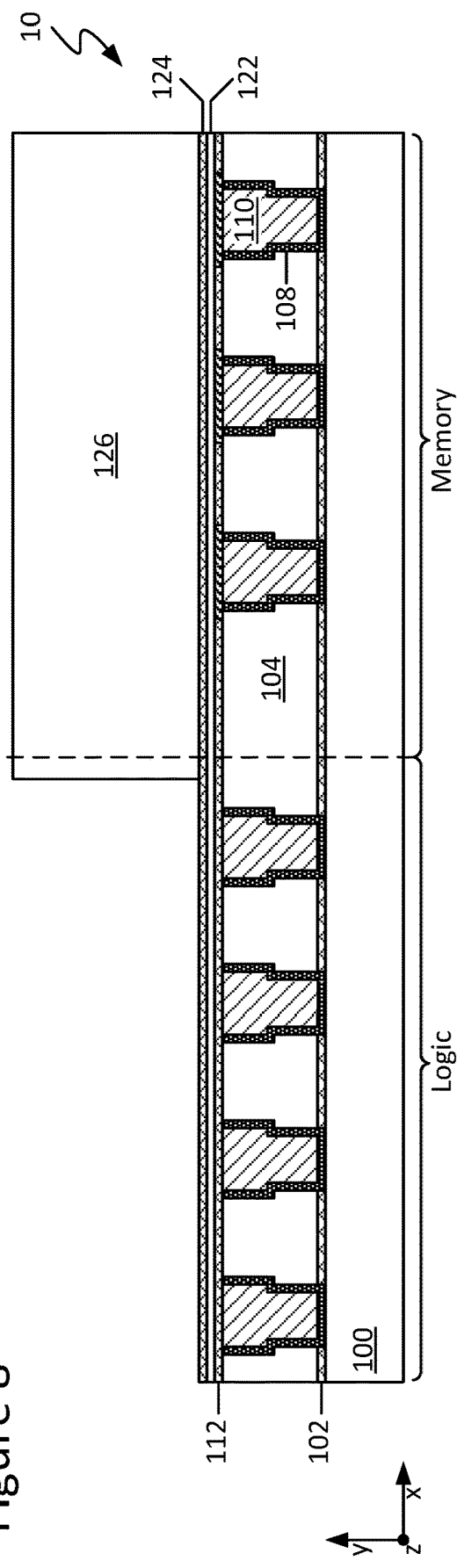

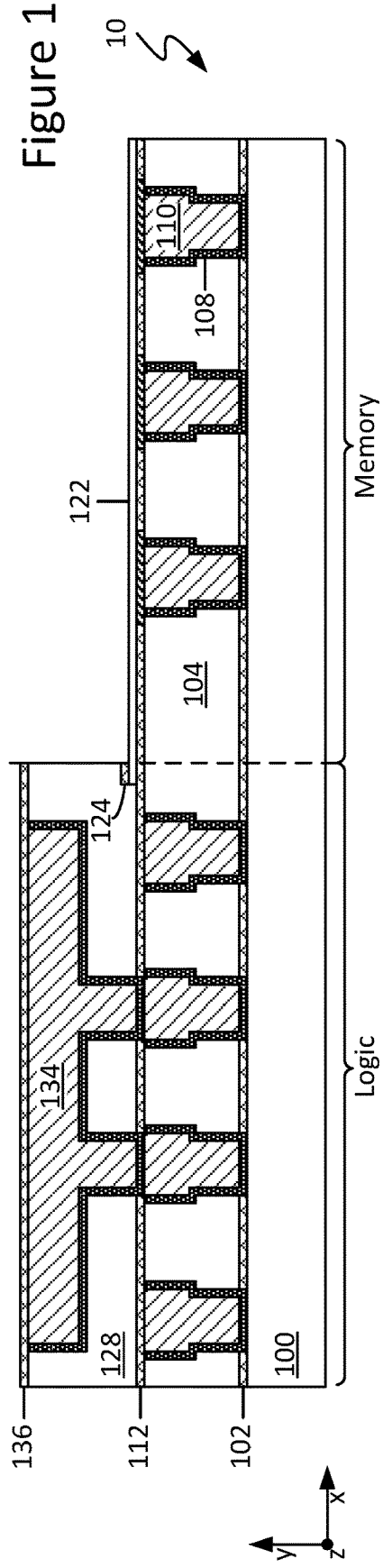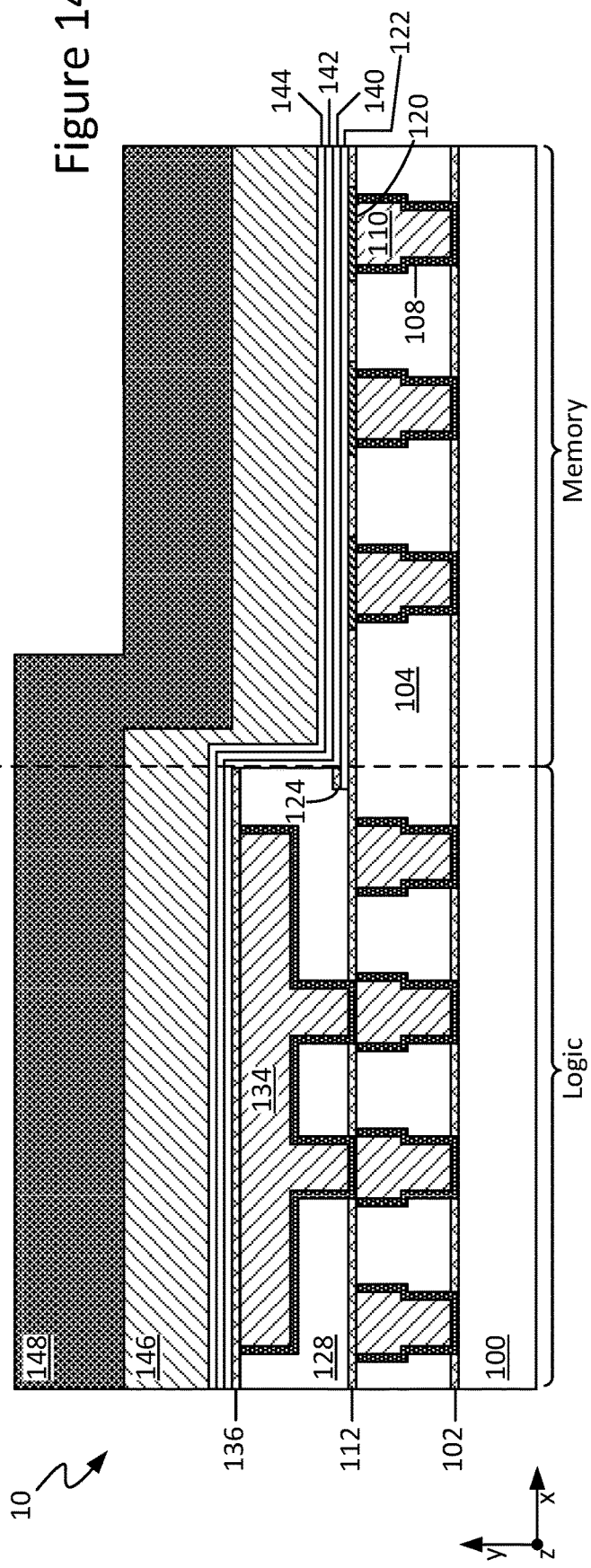

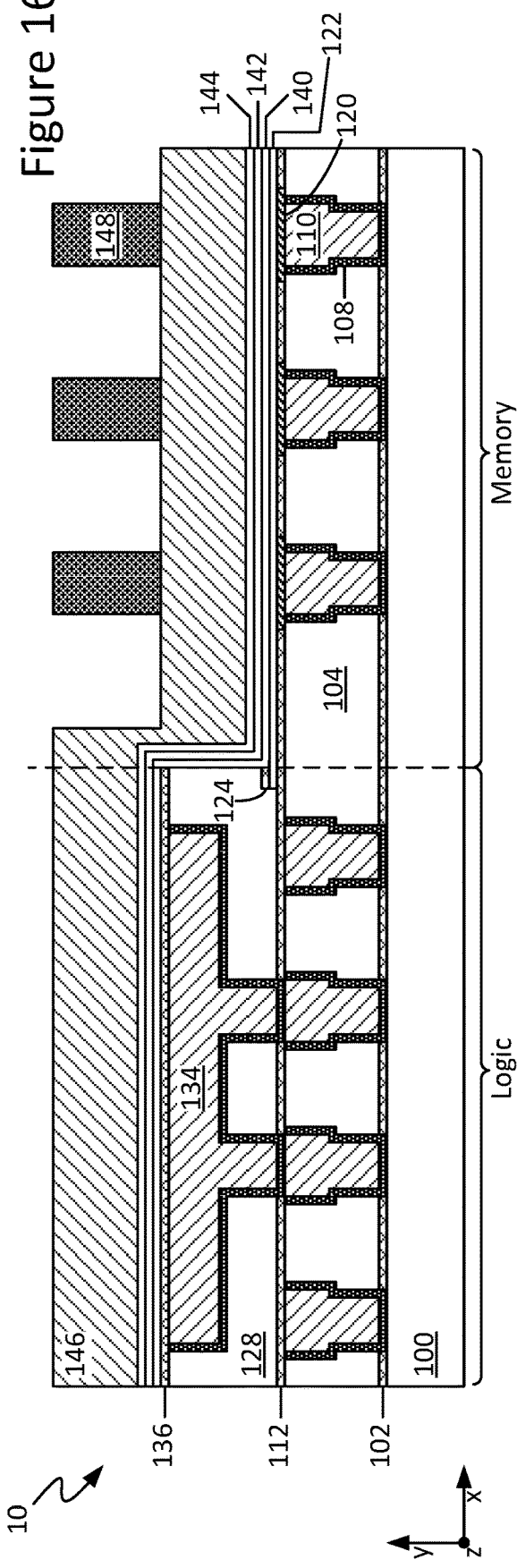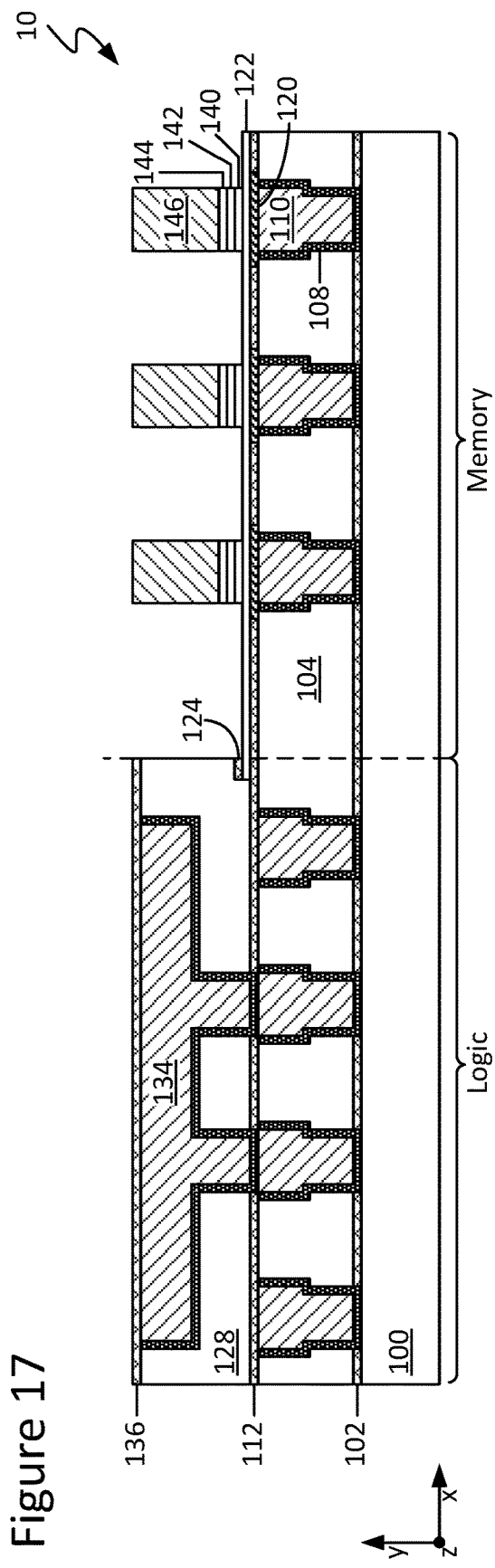

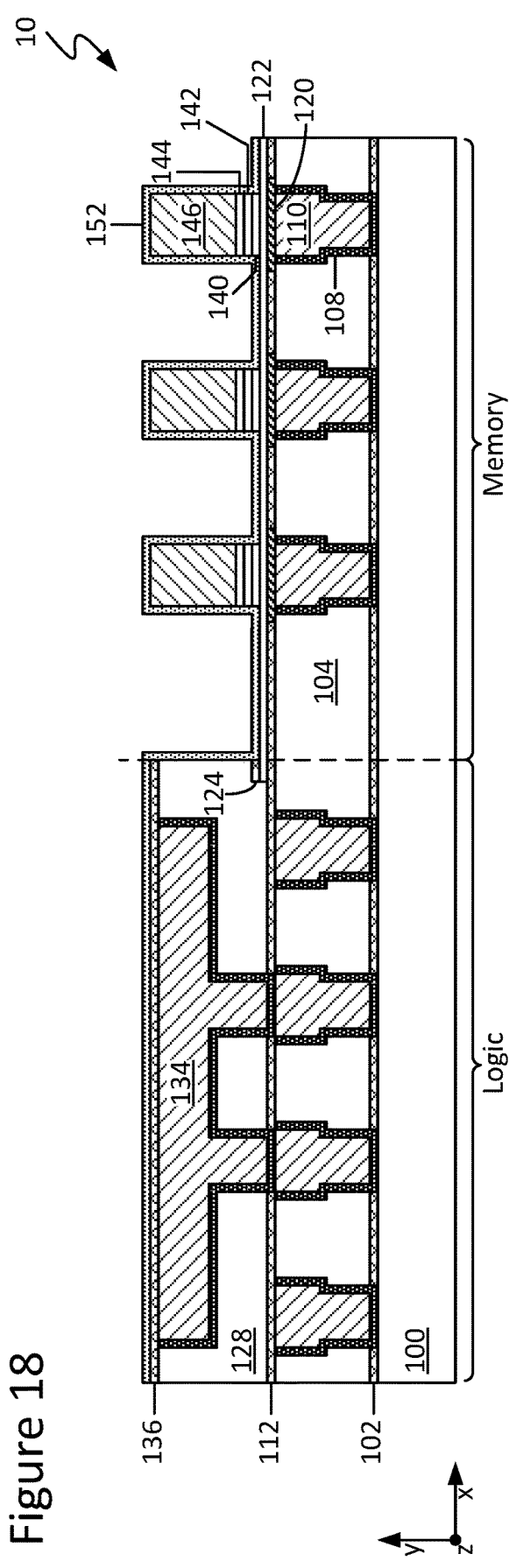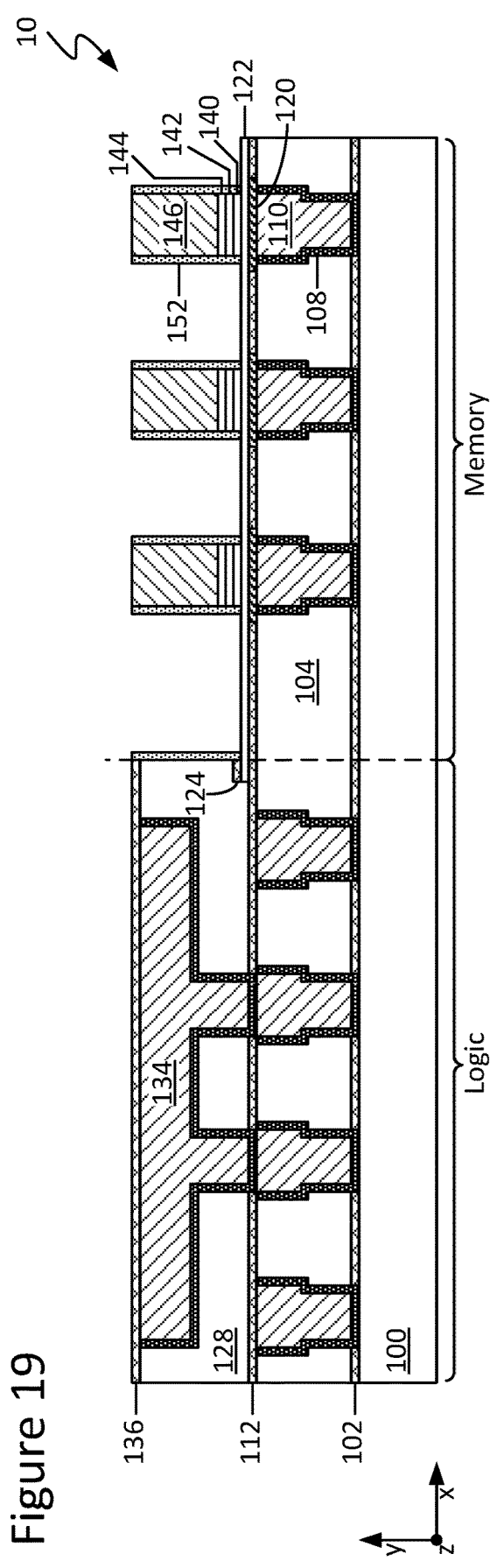

TECHNIQUES FOR FORMING LOGIC INCLUDING INTEGRATED SPIN-TRANSFER TORQUE MAGNETORESISTIVE RANDOM-ACCESS MEMORY

BACKGROUND

Spin-transfer torque memory (STTM) devices, such as spin-transfer torque magnetoresistive random-access memory (STT-MRAM) devices, use spin-based memory technology and include magnetic tunnel junctions (MTJs) that can store a bit of information. Each MTJ has a fixed layer and a free layer, and the direction of magnetization in the free layer determines whether the MTJ is in a high-resistivity state or a low-resistivity state (i.e., whether it is storing a binary 1 or a binary 0). In this manner, STTM is a type of non-volatile memory.

BRIEF DESCRIPTION OF THE DRAWINGS

FIG. 3 illustrates a cross-sectional view of the IC of FIG. 2 after forming and patterning a resist layer, in accordance with an embodiment of the present disclosure.

FIG. 4 illustrates a cross-sectional view of the IC of FIG. 3 after forming one or more openings in a dielectric layer, in accordance with an embodiment of the present disclosure.

FIG. 5 illustrates a cross-sectional view of the IC of FIG. 4 after forming an electrically conductive layer, in accordance with an embodiment of the present disclosure.

FIG. 6 illustrates a cross-sectional view of the IC of FIG. 5 after partially removing the electrically conductive layer, in accordance with an embodiment of the present disclosure.

FIG. 7 illustrates a cross-sectional view of the IC of FIG. 6 after forming an electrically conductive layer and a dielectric layer, in accordance with an embodiment of the present disclosure.

FIG. 8 illustrates a cross-sectional view of the IC of FIG. 7 after forming and patterning a resist layer, in accordance with an embodiment of the present disclosure.

FIG. 13 illustrates a cross-sectional view of the IC of FIG. 12 after partially removing several dielectric layers, in accordance with an embodiment of the present disclosure.

FIG. 14 illustrates a cross-sectional view of the IC of FIG. 13 after forming one or more lower magnetic tunnel junction (MTJ) layers, a tunnel barrier layer, one or more upper MTJ layers, an electrically conductive layer, and a hardmask layer, in accordance with an embodiment of the present disclosure.

FIG. 16 illustrates a cross-sectional view of the IC of FIG. 15 after partially removing a hardmask layer, in accordance with an embodiment of the present disclosure.

FIG. 17 illustrates a cross-sectional view of the IC of FIG. 16 after partially removing an electrically conductive layer, the upper MTJ layer(s), the tunnel barrier layer, and the lower MTJ layer(s), in accordance with an embodiment of the present disclosure.

FIG. 18 illustrates a cross-sectional view of the IC of FIG. 17 after forming a dielectric layer, in accordance with an embodiment of the present disclosure.

FIG. 19 illustrates a cross-sectional view of the IC of FIG. 18 after partially removing a dielectric layer, in accordance with an embodiment of the present disclosure.

Figure 1:
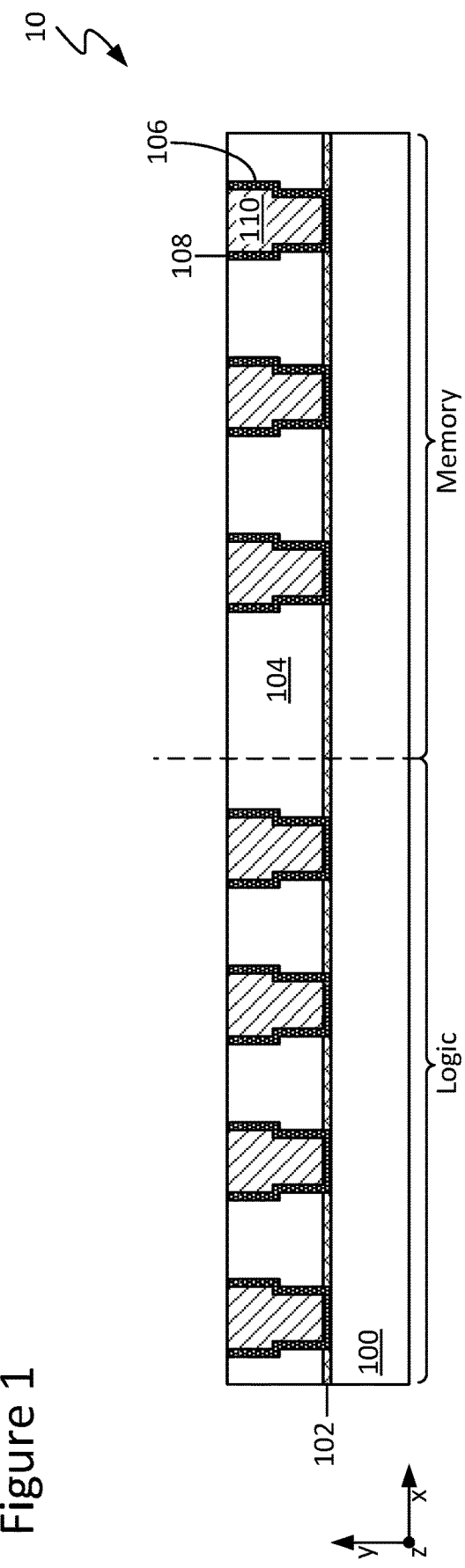
FIG. 1 illustrates a cross-sectional view of an IC configured in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming a logic device including integrated spin-transfer torque magnetoresistive random-access memory (STT-MRAM). In accordance with some embodiments, one or more magnetic tunnel junction (MTJ) devices may be formed within a given back-end-of-line (BEOL) interconnect layer of a host logic device. A given MTJ device may be formed, in accordance with some embodiments, over an electrically conductive layer that may be configured to serve as a pedestal layer for the MTJ's constituent magnetic and insulator layers, providing structural support for the overlying MTJ layers, as well as serving as a spacer intervening between the MTJ layers and any underlying features. In accordance with some embodiments, one or more conformal spacer layers may be formed over sidewalls of a given MTJ device and attendant pedestal layer, providing protection from oxidation and corrosion. A given MTJ device may be electrically coupled with an underlying interconnect or other electrically conductive feature, for example, by another intervening electrically conductive layer configured to serve as a thin via, in accordance with some embodiments. The aforementioned pedestal layer may be disposed, in part or in whole, between the thin via layer and MTJ device, in accordance with some embodiments. Numerous configurations and variations will be apparent in light of this disclosure.

General Overview

Existing charge-based memory technologies such as dynamic random-access memory (DRAM) and NAND flash memory face scalability issues related to increasingly precise charge placement and sensing requirements that limit their ability to be embedded directly onto high-performance logic chips. As device dimensions continue to scale down, these and other non-trivial problems will be exacerbated.

Thus, and in accordance with some embodiments of the present disclosure, techniques are disclosed for forming a logic device including integrated spin-transfer torque magnetoresistive random-access memory (STT-MRAM). In accordance with some embodiments, one or more magnetic tunnel junction (MTJ) devices may be formed within a given back-end-of-line (BEOL) interconnect layer of a host logic device. A given MTJ device may be formed, in accordance with some embodiments, over an electrically conductive layer configured to serve as a pedestal layer for the MTJ's constituent magnetic and insulator layers, providing structural support for the overlying MTJ layers, as well as serving as a spacer intervening between the MTJ layers and any underlying features. In accordance with some embodiments, one or more conformal spacer layers may be formed over sidewalls of a given MTJ device and attendant pedestal layer, providing protection from oxidation and corrosion. A given MTJ device may be electrically coupled with an underlying interconnect or other electrically conductive feature, for example, by another intervening electrically conductive layer configured to serve as a thin via, in accordance with some embodiments. The aforementioned pedestal layer may be disposed, in part or in whole, between the thin via layer and MTJ device, in accordance with some embodiments.

In accordance with some embodiments, techniques disclosed herein may be utilized, for example, in forming one or more MTJ devices after formation of the interconnect(s) of a host BEOL layer. Thus, in a general sense, the disclosed techniques may be considered, for example, an MTJ-last type of process flow in which the one or more MTJs are fabricated after interconnects in a neighboring logic area. In some cases, the disclosed techniques may be used, for example, to provide a high-performance logic unit including one or more embedded or otherwise integrated arrays of MTJ devices in its constituent BEOL interconnect layer(s).

As will be appreciated in light of this disclosure, STT-MRAM, which typically relies on resistivity rather than charge as the information carrier, may scale to smaller dimensions and geometries, for instance, than traditional charge-based memories, such as DRAM and NAND flash memory, to name a few. In accordance with some embodiments, integration of memory directly onto a microprocessor chip or other logic chip utilizing techniques disclosed herein may enable wider busses and higher operation speeds, for example, as compared to more traditional arrangements of physically separate logic and memory chips.

In accordance with some embodiments, use of the disclosed techniques may be detected, for example, by any one, or combination, of scanning electron microscopy (SEM), transmission electron microscopy (TEM), or other suitable top-down or cross-sectional inspection of a given integrated circuit or other semiconductor structure including MTJ devices, pedestal layers, or thin vias configured as variously described herein.

Methodology and Structure

FIGS. 1-24 illustrate a process flow of fabricating an integrated circuit (IC) 10 in accordance with an embodiment of the present disclosure. As shown in the figures, a first portion of IC 10 is generally designated as the logic side of IC 10, whereas a second portion of IC 10 is generally designated as the memory side of IC 10. However, the present disclosure is not intended to be so limited only to side-by-side or other laterally adjacent configurations. In a more general sense, and in accordance with some embodiments, logic device(s) and memory device(s) provided as variously described herein may be disposed, for example, in any generally neighboring relationship, partially or fully embedded relationship, or other proximal configuration, as desired for a given target application or end-use. Numerous configurations and variations will be apparent in light of this disclosure.

The process may begin as in FIG. 1, which illustrates a cross-sectional view of an IC 10 configured in accordance with an embodiment of the present disclosure. As can be seen, IC 10 includes a semiconductor substrate 100, which may have any of a wide range of configurations. For instance, semiconductor substrate 100 may be configured as any one, or combination, of a bulk semiconductor substrate, a semiconductor-on-insulator (XOI, where X represents a semiconductor material) structure such as silicon-on-insulator (SOI), a semiconductor wafer, and a multi-layered structure. In accordance with some embodiments, semiconductor substrate 100 may be formed from any one, or combination, of semiconductor materials, such as silicon (Si), germanium (Ge), and silicon germanium (SiGe), among others. In some cases, semiconductor substrate 100 may include one or more transistors disposed there over. Other suitable materials and configurations for semiconductor substrate 100 will depend on a given application and will be apparent in light of this disclosure.

Also, as can be seen, IC 10 includes a dielectric layer 102 disposed over semiconductor substrate 100. Dielectric layer 102 may be formed from any of a wide range of dielectric materials. For instance, in some embodiments, dielectric layer 102 may be formed from an oxide, such as silicon dioxide ($SiO_2$) or carbon-doped oxide (CDO). In some embodiments, dielectric layer 102 may be formed from a nitride, such as silicon nitride ($Si_3N_4$). In some embodiments, dielectric layer 102 may be formed from a carbide, such as silicon carbide (SiC). In some embodiments, dielectric layer 102 may be formed from an oxynitride, such as silicon oxynitride (SiON) or carbon-doped SiON. In some embodiments, dielectric layer 102 may be formed from a combination of any of the aforementioned materials.

Dielectric layer 102 may be formed over substrate 100 via any suitable standard, custom, or proprietary technique(s), as will be apparent in light of this disclosure. In accordance with some embodiments, dielectric layer 102 may be formed via any one, or combination, of a physical vapor deposition (PVD) process, such as sputter deposition, a spin-on deposition (SOD) process, and a chemical vapor deposition (CVD) process, such as plasma-enhanced CVD (PECVD). Furthermore, the thickness (e.g., x-thickness in the x-direction and/or y-thickness in the y-direction) of dielectric layer 102 may be customized, as desired for a given target application or end-use. In some cases, dielectric layer 102 may have a thickness in the range of about 1-50 nm (e.g., about 1-25 nm, about 25-50 nm, or any other sub-range in the range of about 1-50 nm). In some cases, dielectric layer 102 may be configured to serve, at least in part, as an etch stop layer for IC 10. Other suitable configurations and formation techniques for dielectric layer 102 (e.g., etch stop layer 102) will depend on a given application and will be apparent in light of this disclosure.

As can be seen further, IC 10 includes a dielectric layer 104 disposed over dielectric layer 102. Dielectric layer 104 may be formed with any of the example materials and techniques discussed above, for instance, with respect to dielectric layer 102, in accordance with some embodiments. Furthermore, the thickness (e.g., y-thickness in the y-direction) of dielectric layer 104 may be customized, as desired for a given target application or end-use. In some cases, dielectric layer 104 may have a thickness in the range of about 5 nm-1 µm (e.g., about 5-250 nm, about 250-500 nm, about 500-750 nm, about 750 nm-1 µm, or any other sub-range in the range of about 5 nm-1 µm). In some cases, dielectric layer 104 may be configured to serve, at least in part, as an inter-layer dielectric (ILD) for IC 10. Other suitable configurations and formation techniques for dielectric layer 104 will depend on a given application and will be apparent in light of this disclosure.

In accordance with some embodiments, dielectric layer 104 may be patterned with one or more features 106, which may have any of a wide range of configurations. For instance, in some cases, a given feature 106 may be a trench (single-damascene or dual-damascene), a through-hole, or other opening or recess that extends through the entire thickness of dielectric layer 104 and dielectric layer 102 such that it lands on underlying semiconductor substrate 100. A given feature 106 may be formed via any suitable standard, custom, or proprietary lithography and etch technique(s), as will be apparent in light of this disclosure. In accordance with some embodiments, a given feature 106 may be formed via an etch-and-clean process, which may involve a wet etch or dry etch (or both), the etch chemistry of which may be customized, as desired for a given target application or end-use. Furthermore, the dimensions and cross-sectional geometry of a given feature 106, as well as the pitch or other spacing of neighboring features 106, may be customized, as desired for a given target application or end-use. Other suitable configurations and formation techniques for feature(s) 106 will depend on a given application and will be apparent in light of this disclosure.

In accordance with some embodiments, a barrier layer 108 may be formed over the topography provided by a given feature 106. A given barrier layer 108 may be formed from any of a wide range of materials. For instance, in some embodiments, a given barrier layer 108 may be formed from any one, or combination, of metals, such as tantalum (Ta), cobalt (Co), or ruthenium (Ru), among others. In some embodiments, a given barrier layer 108 may be formed from any one, or combination, of metal nitrides, such as tantalum nitride (TaN) or titanium nitride (TiN), among others. In some embodiments, a given barrier layer 108 may be formed from a combination of any of the aforementioned materials. In some cases, a given barrier layer 108 may be configured to serve, at least in part, as a diffusion barrier layer for a given electrically conductive feature 110 (discussed below) of IC 10. In some cases, a given barrier layer 108 may be configured to serve, at least in part, as a seed layer for a given electrically conductive feature 110 of IC 10.

A given barrier layer 108 may be formed within a given feature 106 via any suitable standard, custom, or proprietary technique(s), as will be apparent in light of this disclosure. In accordance with some embodiments, a given barrier layer 108 may be formed via any one, or combination, of a CVD process, such as PECVD, a PVD process, and an atomic layer deposition (ALD) process. Furthermore, the thickness (e.g., x-thickness in the x-direction and/or y-thickness in the y-direction) of a given barrier layer 108 may be customized, as desired for a given target application or end-use. In some cases, a given barrier layer 108 may have a thickness in the range of about 1-50 nm (e.g., about 1-25 nm, about 25-50 nm, or any other sub-range in the range of about 1-50 nm). In some cases, a given barrier layer 108 may have a substantially uniform thickness over an underlying topography. In some instances, a given barrier layer 108 may be provided as a substantially conformal layer over such topography. In other instances, a given barrier layer 108 may be provided with a non-uniform or otherwise varying thickness over such topography. For example, in some cases a first portion of a given barrier layer 108 may have a thickness within a first range, whereas a second portion thereof may have a thickness within a second, different range. In some instances, a given barrier layer 108 may have first and second portions having average thicknesses that are different from one another by about 20% or less, about 15% or less, about 10% or less, or about 5% or less. Other suitable configurations and formation techniques for barrier layer(s) 108 will depend on a given application and will be apparent in light of this disclosure.

In accordance with some embodiments, a given electrically conductive feature 110 may be formed within a given feature 106 (e.g., over the memory side of IC 10). A given electrically conductive feature 110 may be any one, or combination, of a trench (single-damascene or dual-damascene), a via, a through-body via (TBV), or other interconnect feature, in accordance with some embodiments. In some cases, a given electrically conductive feature 110 may extend through the entire thickness of dielectric layer 104 and dielectric layer 102 such that it lands on underlying semiconductor substrate 100. A given electrically conductive feature 110 may be formed from any one, or combination, of electrically conductive metals, such as copper (Cu), aluminum (Al), tungsten (W), nickel (Ni), cobalt (Co), silver (Ag), gold (Au), titanium (Ti), and tantalum (Ta), among others.

A given electrically conductive feature 110 may be formed via any suitable standard, custom, or proprietary technique(s), as will be apparent in light of this disclosure. In accordance with some embodiments, a given electrically conductive feature 110 may be formed via any one, or combination, of an electroplating process, an electroless deposition process, an ALD process, a PVD process, and a CVD process, among others. Furthermore, the dimensions and geometry of a given electrically conductive feature 110, as well as the pitch or other spacing of neighboring electrically conductive features 110, may be customized, as desired for a given target application or end-use, and in some cases may depend at least in part on the dimensions, geometry, and pitch or other spacing of host feature(s) 106. Any overburden of electrically conductive feature(s) 110 may be removed, for example, via a chemical-mechanical planarization (CMP) process or other suitable planarization process, as will be apparent in light of this disclosure. Other suitable configurations and formation techniques for electrically conductive feature(s) 110 will depend on a given application and will be apparent in light of this disclosure.

Figure 2:
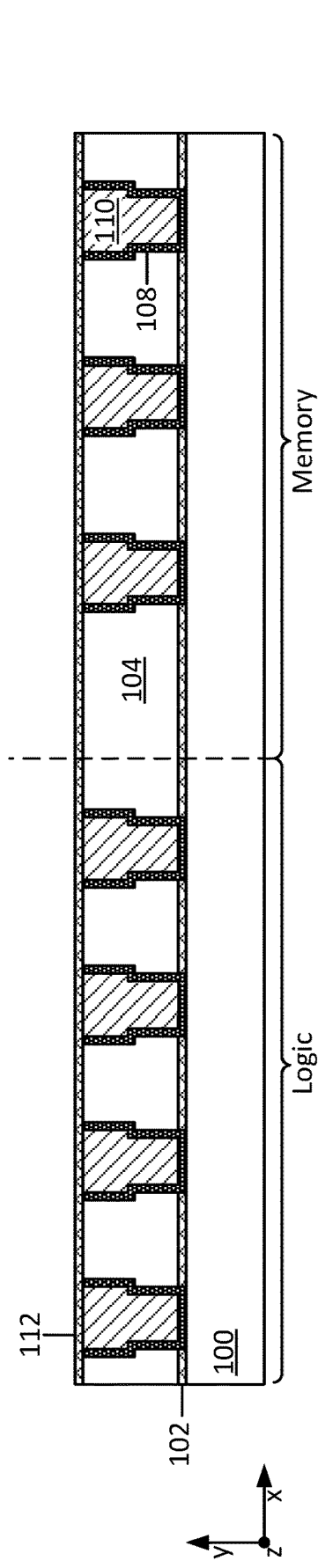
FIG. 2 illustrates a cross-sectional view of the IC of FIG. 1 after forming a dielectric layer, in accordance with an embodiment of the present disclosure.

The process may continue as in FIG. 2, which illustrates a cross-sectional view of the IC 10 of FIG. 1 after forming a dielectric layer 112, in accordance with an embodiment of the present disclosure. Dielectric layer 112 may be formed with any of the example materials, techniques, and dimensions discussed above, for instance, with respect to dielectric layer 102, in accordance with some embodiments. In some cases, dielectric layer 102 may be configured to serve, at least in part, as an etch stop layer for IC 10. Other suitable configurations and formation techniques for dielectric layer 112 (e.g., etch stop layer 112) will depend on a given application and will be apparent in light of this disclosure.

The process may continue as in FIG. 3, which illustrates a cross-sectional view of IC 10 of FIG. 2 after forming and patterning a resist layer 114, in accordance with an embodiment of the present disclosure. Resist layer 114 may be formed over a topography provided, at least in part, by dielectric layer 112, in accordance with some embodiments. Resist layer 114 may be formed from any of a wide range of materials, including any one, or combination, of a photoresist material, a patterning material (e.g., such as an anti-reflective coating, or ARC), a gap-fill material, and a planarizing material, among others. In some cases, an underlying hardmask material optionally may be present beneath resist layer 114 to aid in transferring a pattern of feature(s) 116 to underlying dielectric layer 112, as described below with respect to FIG. 4.

Resist layer 114 may be formed via any one, or combination, of suitable standard, custom, or proprietary techniques, as will be apparent in light of this disclosure. Furthermore, the thickness (e.g., y-thickness in the y-direction) of resist layer 114 may be customized, as desired for a given target application or end-use. Other suitable configurations and formation techniques for resist layer 114 will depend on a given application and will be apparent in light of this disclosure.

In accordance with some embodiments, resist layer 114 may be patterned with one or more features 116. As generally shown in FIG. 3, a given feature 116 may be, for example, a through-hole or other opening or recess that extends through the entire thickness of resist layer 114 such that it exposes the surface of underlying dielectric layer 112, landing over an underlying electrically conductive feature 110 on the memory side of IC 10, in accordance with some embodiments. A given feature 116 may align with a portion of the memory side of IC 10 where an electrically conductive layer 120 (discussed below) is to be formed, in accordance with some embodiments. A given feature 116 may be formed via any suitable standard, custom, or proprietary resist exposure and development technique(s), as will be apparent in light of this disclosure. Furthermore, the dimensions and geometry of a given feature 116, as well as the pitch or other spacing of neighboring features 116, may be customized, as desired for a given target application or end-use. Other suitable configurations and formation techniques for feature(s) 116 will depend on a given application and will be apparent in light of this disclosure.

The process may continue as in FIG. 4, which illustrates a cross-sectional view of IC 10 of FIG. 3 after forming one or more openings 118 in dielectric layer 112, in accordance with an embodiment of the present disclosure. As can be seen, portion(s) of dielectric layer 112 may be removed by utilizing patterned resist layer 114 (e.g., patterned with one or more features 116) as a mask and etching through dielectric layer 112, transferring the pattern of feature(s) 116 to underlying dielectric layer 112. To that end, a given opening 118 may be formed, in accordance with some embodiments, using an anisotropic dry plasma etching process, the etch chemistry of which may be customized, as desired for a given target application or end-use. In partially removing dielectric layer 112 in this manner, the resultant opening(s) 118 may expose the surface of a given underlying electrically conductive feature 110 and associated barrier layer 108, as well as one or more portions of dielectric layer 104. In accordance with some embodiments, any remainder of resist layer 114 may be removed from IC 10, for example, via a plasma ash-and-clean process, and any remaining etch polymer or residue may be removed, for example, via a wet clean process. Other suitable configurations and formation techniques for opening(s) 118 will depend on a given application and will be apparent in light of this disclosure.

The process may continue as in FIG. 5, which illustrates a cross-sectional view of IC 10 of FIG. 4 after forming an electrically conductive layer 120, in accordance with an embodiment of the present disclosure. Electrically conductive layer 120 may be formed from any of a wide range of electrically conductive materials. For instance, in some embodiments, electrically conductive layer 120 may be formed from any one, or combination, of electrically conductive metals, such as titanium (Ti), tantalum (Ta), ruthenium (Ru), cobalt (Co), and tungsten (W), among others. In some embodiments, electrically conductive layer 120 may be formed from any one, or combination, of electrically conductive metal nitrides, such as tantalum nitride (TaN), titanium nitride (TiN), and titanium zirconium nitride (TiZrN), among others. In some embodiments, electrically conductive layer 120 may be formed from a combination of any of the aforementioned materials.

Electrically conductive layer 120 may be formed via any suitable standard, custom, or proprietary technique(s), as will be apparent in light of this disclosure. In accordance with some embodiments, electrically conductive layer 120 may be formed via any one, or combination, of a PVD process, a CVD process, and an ALD process. Furthermore, the initial thickness (e.g., y-thickness in the y-direction) of electrically conductive layer 120 may be customized, as desired for a given target application or end-use. In some cases, electrically conductive layer 120 may have an initial thickness in the range of about 10-200 nm (e.g., about 10-50 nm, about 50-100 nm, about 100-150 nm, about 150-200 nm, or any other sub-range in the range of about 10-200 nm). As can be seen in FIG. 5, electrically conductive layer 120 may be formed so as to fill into opening(s) 118, in accordance with some embodiments.

The process may continue as in FIG. 6, which illustrates a cross-sectional view of IC 10 of FIG. 5 after partially removing electrically conductive layer 120, in accordance with an embodiment of the present disclosure. Any overburden of electrically conductive layer 120 may be removed, for example, via a CMP process or other suitable planarization process, as will be apparent in light of this disclosure. In some instances, the CMP or other planarization process may stop, for example, on dielectric layer 112, which, as discussed above, may be configured to serve as an etch stop layer. After removal of the overburden, at least a portion of electrically conductive layer 120 may remain disposed within opening(s) 118, and that portion of electrically conductive layer 120 may be configured to serve, at least in part, as a thin via layer for a magnetic tunnel junction (MTJ) device (discussed below) disposed there over, in accordance with some embodiments. The post-planarization thickness (e.g., y-thickness in the y-direction) of electrically conductive layer 120 may be customized, as desired for a given target application or end-use. In some cases, electrically conductive layer 120 may have a post-planarization thickness in the range of about 1-50 nm (e.g., about 1-25 nm, about 25-50 nm, or any other sub-range in the range of about 1-50 nm). As will be appreciated in light of this disclosure, it may be desirable to ensure that the amount of electrically conductive layer 120 remaining within opening(s) 118 after planarization is sufficient to prevent or otherwise minimize diffusion of the constituent material(s) of an underlying electrically conductive feature 110. Other suitable configurations and formation techniques for electrically conductive layer 120 (e.g., thin via layer 120) will depend on a given application and will be apparent in light of this disclosure.

The process may continue as in FIG. 7, which illustrates a cross-sectional view of IC 10 of FIG. 6 after forming an electrically conductive layer 122 and a dielectric layer 124, in accordance with an embodiment of the present disclosure. Electrically conductive layer 122 may be formed with any of the example materials, techniques, and dimensions discussed above, for instance, with respect to electrically conductive layer 120, in accordance with some embodiments. In some cases, electrically conductive layer 122 may be configured to serve, at least in part, as a pedestal layer for an overlying MTJ device, such as, for example, lower MTJ layer(s) 140, tunnel barrier layer 142, and upper MTJ layer(s) 144 (each discussed below). As a pedestal layer, electrically conductive layer 122 may serve, at least in part, as a support structure for its overlying MTJ device, as well as a spacer intervening between the MTJ device and an underlying electrically conductive layer 120 (e.g., thin via layer 120), in accordance with some embodiments. Other suitable configurations and formation techniques for electrically conductive layer 122 (e.g., pedestal layer 122) will depend on a given application and will be apparent in light of this disclosure.

Dielectric layer 124 may be formed with any of the example materials, techniques, and dimensions discussed above, for instance, with respect to dielectric layer 102, in accordance with some embodiments. In some cases, dielectric layer 124 may be configured to serve, at least in part, as an etch stop layer for IC 10. Other suitable configurations and formations techniques for dielectric layer 124 (e.g., etch stop layer 124) will depend on a given application and will be apparent in light of this disclosure.

The process may continue as in FIG. 8, which illustrates a cross-sectional view of IC 10 of FIG. 7 after forming and patterning a resist layer 126, in accordance with an embodiment of the present disclosure. As generally shown in FIG. 8, resist layer 126 may be formed over IC 10 and patterned so as to reside primarily over the memory side of IC 10, though in some cases, resist layer 126 at least partially may extend over to the logic side of IC 10. Resist layer 126 may be formed with any of the example materials, techniques, and dimensions discussed above, for instance, with respect to resist layer 114, in accordance with some embodiments. Furthermore, in some cases, an underlying hardmask material optionally may be present beneath resist layer 126 to aid in transferring the pattern of resist layer 126 to underlying electrically conductive layer 122 and dielectric layer 124, as described below with respect to FIG. 9. Other suitable configurations and formation techniques for resist layer 126 will depend on a given application and will be apparent in light of this disclosure.

Figure 9:
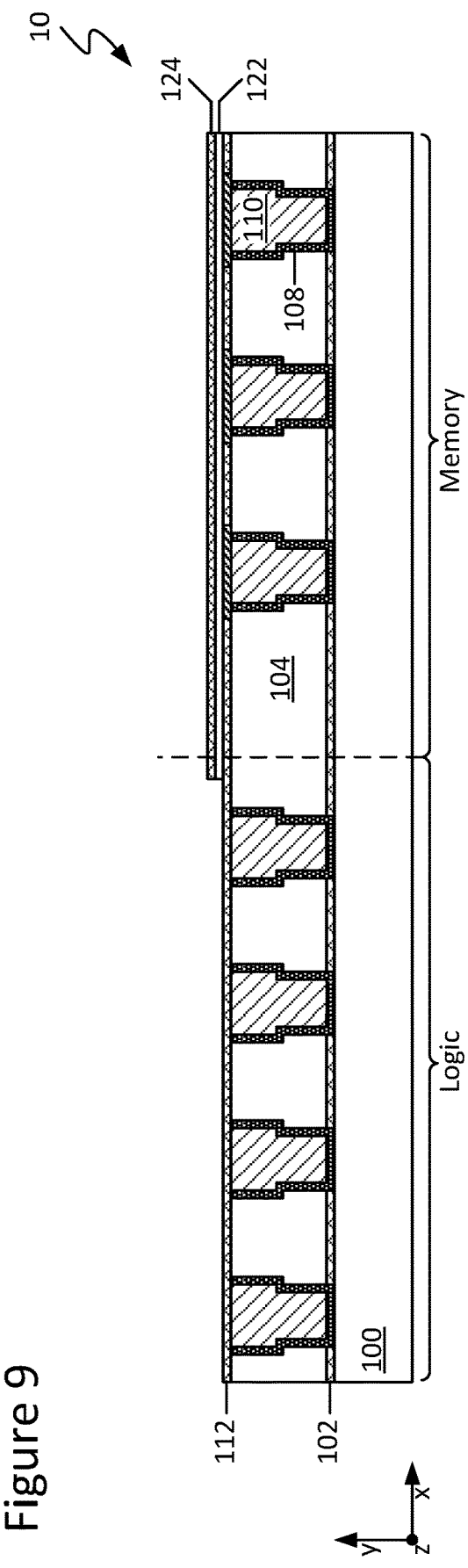
FIG. 9 illustrates a cross-sectional view of the IC of FIG. 8 after partially removing an electrically conductive layer and a dielectric layer, in accordance with an embodiment of the present disclosure.

The process may continue as in FIG. 9, which illustrates a cross-sectional view of IC 10 of FIG. 8 after partially removing electrically conductive layer 122 and dielectric layer 124, in accordance with an embodiment of the present disclosure. As generally shown in FIG. 9, portion(s) of electrically conductive layer 122 and dielectric layer 124 may be removed by utilizing patterned resist layer 126 as a mask and etching through electrically conductive layer 122 and dielectric layer 124. To that end, in accordance with some embodiments, any one, or combination, of suitable dry or wet etch processes can be used, the etch chemistry of which may be customized, as desired for a given target application or end-use. In partially removing electrically conductive layer 122 and dielectric layer 124, the surface of underlying dielectric layer 112 may be exposed. Any remainder of resist layer 126 and any remaining etch polymer or residue may be removed from IC 10 via any of the example techniques discussed above, for instance, with respect to resist layer 114, in accordance with some embodiments. Other suitable configurations and techniques for partially removing electrically conductive layer 122 (e.g., pedestal layer 122) and dielectric layer 124 (e.g., etch stop layer 124) will depend on a given application and will be apparent in light of this disclosure.

Figure 10:
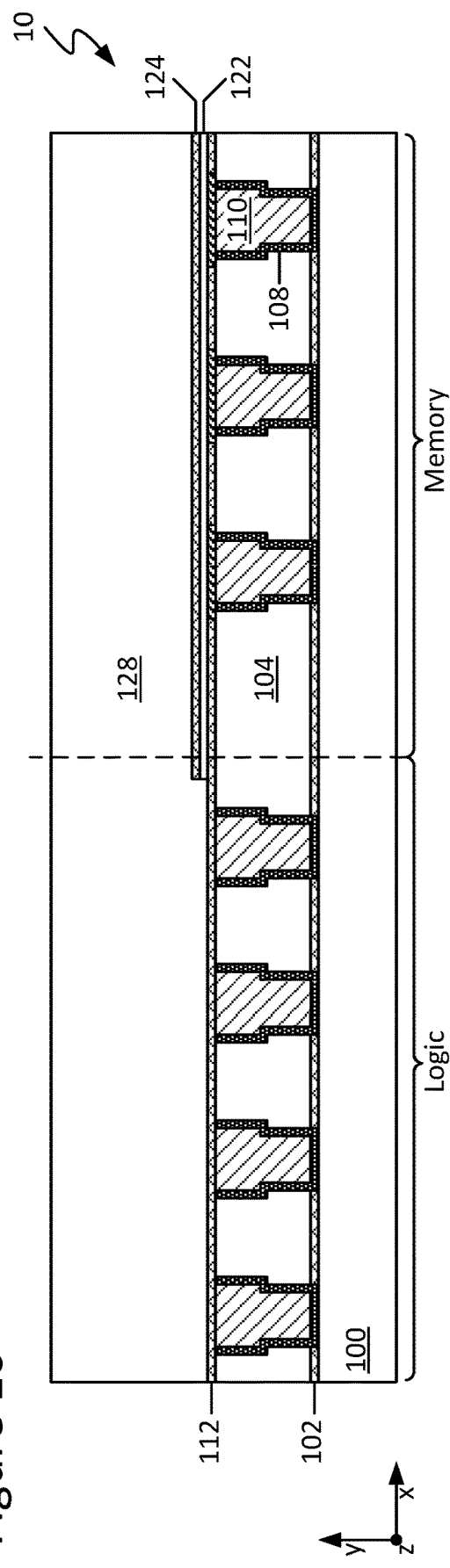
FIG. 10 illustrates a cross-sectional view of the IC of FIG. 9 after forming a dielectric layer, in accordance with an embodiment of the present disclosure.

The process may continue as in FIG. 10, which illustrates a cross-sectional view of IC 10 of FIG. 9 after forming a dielectric layer 128, in accordance with an embodiment of the present disclosure. Dielectric layer 128 may be formed from any of a wide range of dielectric materials. For instance, in some embodiments, dielectric layer 128 may be formed from any one, or combination, of an oxide, such as silicon dioxide ($SiO_2$), fluorinated silicon oxide (SiOF), or carbon-doped oxide (CDO), among others. In some embodiments, dielectric layer 128 may be formed from a nitride, such as silicon nitride ($Si_3N_4$). In some embodiments, dielectric layer 128 may be formed from a glass, such as borophosphosilicate glass (BPSG). In some embodiments, dielectric layer 128 may be formed from a low-κ dielectric material having a dielectric constant (κ) of about 3.0 or less (e.g., about 2.8 or less, about 2.5 or less, about 2.2 or less, about 2.0 or less, or any other sub-range in the range of about 3.0 or less). In some embodiments, dielectric layer 128 may be formed from a combination of any of the aforementioned materials. Furthermore, dielectric layer 128 may be formed with any of the example techniques and dimensions discussed above, for instance, with respect to dielectric layer 104, in accordance with some embodiments. In some cases, dielectric layer 128 may be configured to serve, at least in part, as an ILD for IC 10. Other suitable configurations and formation techniques for dielectric layer 128 will depend on a given application and will be apparent in light of this disclosure.

Figure 11:
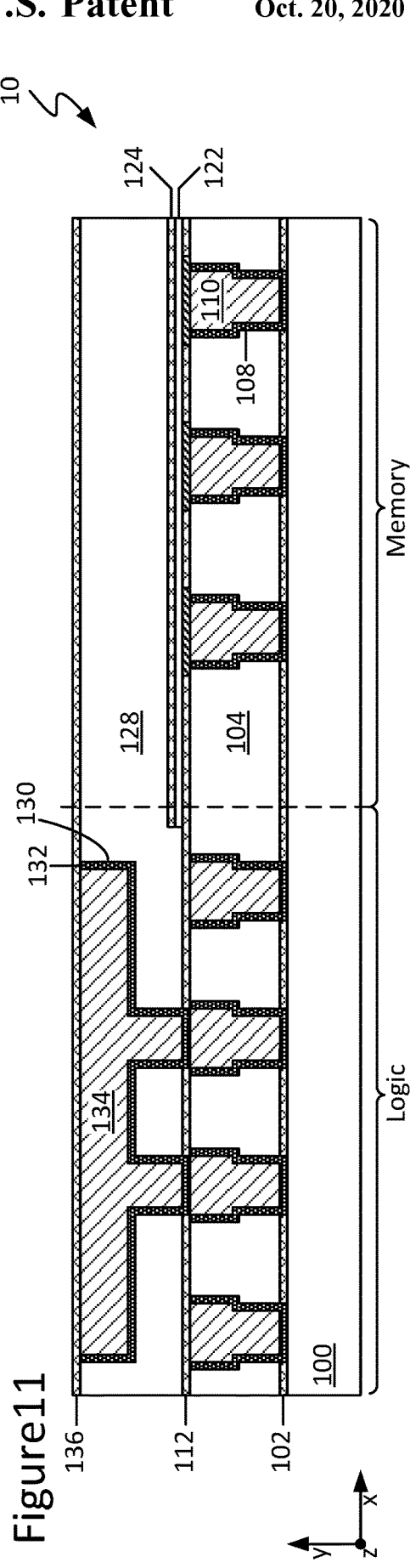
FIG. 11 illustrates a cross-sectional view of the IC of FIG. 10 after forming one or more features in a dielectric layer, one or more barrier layers in those feature(s), one or more electrically conductive features within those feature(s), and another dielectric layer, in accordance with an embodiment of the present disclosure.

The process may continue as in FIG. 11, which illustrates a cross-sectional view of IC 10 of FIG. 10 after forming one or more features 130 in dielectric layer 128, one or more barrier layers 132 in feature(s) 130, one or more electrically conductive features 134 within feature(s) 130, and a dielectric layer 136, in accordance with an embodiment of the present disclosure. Feature(s) 130 may have any of a wide range of configurations. For instance, a given feature 130 may be a trench (single-damascene or dual-damascene), a through-hole, or other opening or recess that extends through the entire thickness of dielectric layer 128 and dielectric layer 112 such that it exposes the surface of an underlying electrically conductive feature 110, landing there over on the logic side of IC 10, in accordance with some embodiments. A given feature 130 may be formed with any of the example techniques discussed above, for instance, with respect to feature(s) 106, in accordance with some embodiments. Furthermore, the dimensions and geometry of a given feature 130, as well as the pitch or other spacing of neighboring features 130, may be customized, as desired for a given target application or end-use. Other suitable configurations and formation techniques for feature(s) 130 will depend on a given application and will be apparent in light of this disclosure.

In accordance with some embodiments, a barrier layer 132 may be formed over the topography provided by a given feature 130. A given barrier layer 132 may be formed with any of the example materials, techniques, and dimensions discussed above, for instance, with respect to barrier layer(s) 108, in accordance with some embodiments. In some cases, a given barrier layer 132 may be configured to serve, at least in part, as a diffusion barrier layer for a given electrically conductive feature 134 (discussed below) of IC 10. In some cases, a given barrier layer 132 may be configured to serve, at least in part, as a seed layer for a given electrically conductive feature 134 of IC 10. In some cases, a given barrier layer 132 may have a substantially uniform thickness (e.g., x-thickness in the x-direction and/or y-thickness in the y-direction) over an underlying topography. In some instances, a given barrier layer 132 may be provided as a substantially conformal layer over such topography. In other instances, a given barrier layer 132 may be provided with a non-uniform or otherwise varying thickness over such topography. For example, in some cases a first portion of a given barrier layer 132 may have a thickness within a first range, whereas a second portion thereof may have a thickness within a second, different range. In some instances, a given barrier layer 132 may have first and second portions having average thicknesses that are different from one another by about 20% or less, about 15% or less, about 10% or less, or about 5% or less. Other suitable configurations and formation techniques for barrier layer(s) 132 will depend on a given application and will be apparent in light of this disclosure.

In accordance with some embodiments, a given electrically conductive feature 134 may be formed within a given feature 130 (e.g., over the logic side of IC 10). A given electrically conductive feature 134 may be formed with any of the example materials and techniques discussed above, for instance, with respect to electrically conductive feature(s) 110, in accordance with some embodiments. Furthermore, the dimensions and geometry of a given electrically conductive feature 134, as well as the pitch or other spacing of neighboring electrically conductive features 134, may be customized, as desired for a given target application or end-use, and in some cases may depend at least in part on the dimensions, geometry, and pitch or other spacing of host feature(s) 134. Any overburden of electrically conductive feature(s) 134 may be removed via any of the example techniques discussed above, for instance, with respect to electrically conductive feature(s) 110, in accordance with some embodiments. Other suitable configurations and formation techniques for electrically conductive feature(s) 134 will depend on a given application and will be apparent in light of this disclosure.

In accordance with some embodiments, a dielectric layer 136 may be formed over the topography provided by dielectric layer 128, barrier layer(s) 132, and electrically conductive feature(s) 134. Dielectric layer 136 may be formed with any of the example materials, techniques, and dimensions discussed above, for instance, with respect to dielectric layer 102, in accordance with some embodiments. In some cases, dielectric layer 136 may be configured to serve, at least in part, as an etch stop layer for IC 10. Other suitable configurations and formation techniques for dielectric layer 136 (e.g., etch stop layer 136) will depend on a given application and will be apparent in light of this disclosure.

Figure 12:
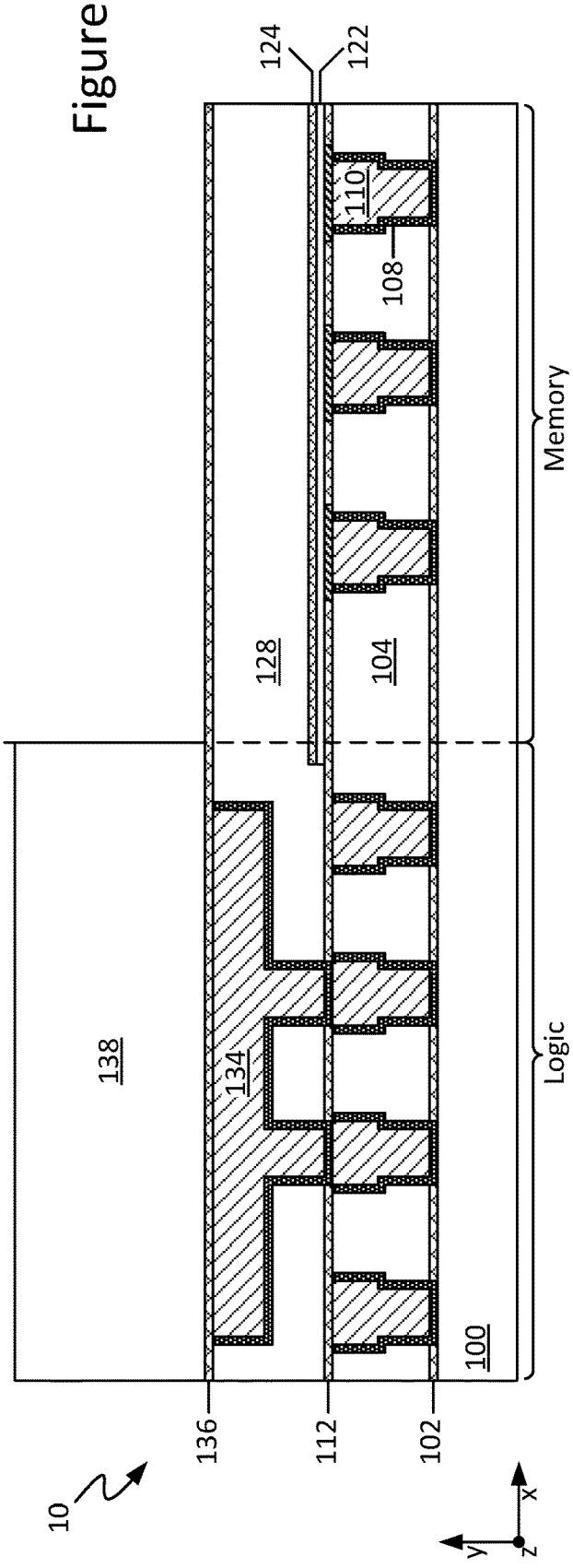
FIG. 12 illustrates a cross-sectional view of the IC of FIG. 11 after forming and patterning a resist layer, in accordance with an embodiment of the present disclosure.

The process may continue as in FIG. 12, which illustrates a cross-sectional view of IC 10 of FIG. 11 after forming and patterning a resist layer 138, in accordance with an embodiment of the present disclosure. As generally shown in FIG. 12, resist layer 138 may be formed over IC 10 and patterned so as to reside primarily over the logic side of IC 10. Resist layer 138 may be formed with any of the example materials, techniques, and dimensions discussed above, for instance, with respect to resist layer 114, in accordance with some embodiments. Furthermore, in some cases, an underlying hardmask material optionally may be present beneath resist layer 138 to aid in transferring the pattern of resist layer 138 to underlying dielectric layers 136, 128, and 124, as described below with respect to FIG. 13. Other suitable configurations and formation techniques for resist layer 138 will depend on a given application and will be apparent in light of this disclosure.

The process may continue as in FIG. 13, which illustrates a cross-sectional view of IC 10 of FIG. 12 after partially removing dielectric layers 136, 128, and 124, in accordance with an embodiment of the present disclosure. As generally shown in FIG. 13, portion(s) of dielectric layers 136, 128, and 124 may be removed by utilizing patterned resist layer 138 as a mask and etching through dielectric layers 136, 128, and 124. To that end, any of the example techniques discussed above, for instance, with respect to partially removing electrically conductive layer 122 and dielectric layer 124 may be used, in accordance with some embodiments. In partially removing dielectric layers 136, 128, and 124, the surface of underlying dielectric layer 122 may be exposed. Any remainder of resist layer 138 and any remaining etch polymer or residue may be removed from IC 10 via any of the example techniques discussed above, for instance, with respect to resist layer 114, in accordance with some embodiments. Other suitable configurations and techniques for partially removing dielectric layer 136 (e.g., etch stop layer 136), dielectric layer 128, and dielectric layer 124 (e.g., etch stop layer 124) will depend on a given application and will be apparent in light of this disclosure.

The process may continue as in FIG. 14, which illustrates a cross-sectional view of IC 10 of FIG. 13 after forming one or more lower magnetic tunnel junction (MTJ) layers 140, a tunnel barrier layer 142, one or more upper MTJ layers 144, an electrically conductive layer 146, and a hardmask layer 148, in accordance with an embodiment of the present disclosure. In some cases, lower MTJ layer(s) 140 may be configured to serve as a free or dynamic magnetic layer or layers (e.g., as a memory layer or layers), whereas in some other cases, lower MTJ layer(s) 140 may be configured to serve as a fixed magnetic layer or layers (e.g., as a pinned reference layer or layers). To such ends, lower MTJ layer(s) 140 may be formed from any of a wide range of materials. For instance, in some embodiments, lower MTJ layer(s) 140 may be formed from any one, or combination, of magnetic metals, such as iron (Fe), tantalum (Ta), ruthenium (Ru), and cobalt (Co), among others, as well an alloy of any thereof. In some embodiments, lower MTJ layer(s) 140 may be formed from an alloy of transition metals, such as cobalt-palladium (CoPd) or cobalt-platinum (CoPt). In some embodiments, lower MTJ layer(s) 140 may be formed from an alloy of one or more transition metals and a metalloid, such as cobalt-iron-boron (CoFeB). In some embodiments, lower MTJ layer(s) 140 may be formed from a combination of any of the aforementioned materials.

It should be noted that, although generally illustrated in the figures as a single layer, lower MTJ layer(s) 140 are not intended to be limited only to single layer configurations. In some embodiments, lower MTJ layer(s) 140 may be configured as bi-layer, tri-layer, or other multi-layer structures, having multiple constituent layers. For instance, in an example case, lower MTJ layer(s) 140 may be formed as a CoFeB/Ru/CoFeB stack. Numerous configurations will be apparent in light of this disclosure.

Lower MTJ layer(s) 140 may be formed, in part or in whole, via any suitable standard, custom, or proprietary technique(s), as desired for a given target application or end-use. In accordance with some embodiments, lower MTJ layer(s) 140 may be formed via any one, or combination, of a PVD process such as sputter deposition, a CVD process, an ALD process, and a molecular beam epitaxy (MBE) process. Furthermore, the thickness (e.g., y-thickness in the y-direction) of lower MTJ layer(s) 140 may be customized, as desired for a given target application or end-use. In some cases, a given lower MTJ layer 140 may have a thickness in the range of about 1-50 nm (e.g., about 1-25 nm, about 25-50 nm, or any other sub-range in the range of about 1-50 nm). In some cases, lower MTJ layer(s) 140 may have a substantially uniform thickness over an underlying topography. In some instances, lower MTJ layer(s) 140 may be provided as a substantially conformal layer over such topography. In other instances, lower MTJ layer(s) 140 may be provided with a non-uniform or otherwise varying thickness over such topography. For example, in some cases a first portion of lower MTJ layer(s) 140 may have a thickness within a first range, whereas a second portion thereof may have a thickness within a second, different range. In some instances, lower MTJ layer(s) 140 may have first and second portions having average thicknesses that are different from one another by about 20% or less, about 15% or less, about 10% or less, or about 5% or less. Other suitable configurations and formation techniques for lower MTJ layer(s) 140 will depend on a given application and will be apparent in light of this disclosure.

In accordance with some embodiments, tunnel barrier layer 142 may be formed from any suitable tunnel barrier material. For instance, in some embodiments, tunnel barrier layer 142 may be formed from any one, or combination, of suitable insulator materials, such as magnesium oxide (MgO) or aluminum oxide ($Al_2O_3$), among others. Tunnel barrier layer 142 may be formed with any of the example techniques discussed above, for instance, with respect to lower MTJ layer(s) 140, in accordance with some embodiments. Furthermore, the thickness (e.g., y-thickness in the y-direction) of tunnel barrier layer 142 may be customized, as desired for a given target application or end-use. In some cases, tunnel barrier layer 142 may have a thickness in the range of about 0.1-15 nm (e.g., about 0.1-5 nm, about 5-10 nm, about 10-15 nm, or any other sub-range in the range of about 0.1-15 nm). In some cases, tunnel barrier layer 142 may have a substantially uniform thickness over an underlying topography. In some instances, tunnel barrier layer 142 may be provided as a substantially conformal layer over such topography. In other instances, tunnel barrier layer 142 may be provided with a non-uniform or otherwise varying thickness over such topography. For example, in some cases a first portion of tunnel barrier layer 142 may have a thickness within a first range, whereas a second portion thereof may have a thickness within a second, different range. In some instances, tunnel barrier layer 142 may have first and second portions having average thicknesses that are different from one another by about 20% or less, about 15% or less, about 10% or less, or about 5% or less. Other suitable configurations and formation techniques for tunnel barrier layer 142 will depend on a given application and will be apparent in light of this disclosure.

In some cases, upper MTJ layer(s) 144 may be configured to serve as a fixed magnetic layer or layers (e.g., as a pinned reference layer or layers), whereas in some other cases, upper MTJ layer(s) 144 may be configured to serve as a free or dynamic magnetic layer or layers (e.g., as a memory layer or layers). To such ends, upper MTJ layer(s) 144 may be formed, in part or in whole, with any of the example materials, techniques, and dimensions discussed above, for instance, with respect to lower MTJ layer(s) 140, in accordance with some embodiments. Other suitable configurations and formation techniques for upper MTJ layer(s) 144 will depend on a given application and will be apparent in light of this disclosure.

Electrically conductive layer 146 may be formed with any of the example materials and techniques discussed above, for instance, with respect to electrically conductive layer 120, in accordance with some embodiments. Furthermore, the thickness (e.g., y-thickness in the y-direction) of electrically conductive layer 146 may be customized, as desired for a given target application or end-use. In some cases, electrically conductive layer 146 may have a thickness in the range of about 1 nm-1 μm (e.g., about 1-250 nm, about 250-500 nm, about 500-750 nm, about 750 nm-1 μm, or any other sub-range in the range of about 1 nm-1 μm). In some cases, electrically conductive layer 146 may have a substantially uniform thickness over an underlying topography. In some instances, electrically conductive layer 146 may be provided as a substantially conformal layer over such topography. In other instances, electrically conductive layer 146 may be provided with a non-uniform or otherwise varying thickness over such topography. For example, in some cases a first portion of electrically conductive layer 146 may have a thickness within a first range, whereas a second portion thereof may have a thickness within a second, different range. In some instances, electrically conductive layer 146 may have first and second portions having average thicknesses that are different from one another by about 20% or less, about 15% or less, about 10% or less, or about 5% or less. In some cases, electrically conductive layer 146 may be configured to serve, for example, as an electrode for underlying upper MTJ layer 144. Other suitable configurations and formation techniques for electrically conductive layer 146 will depend on a given application and will be apparent in light of this disclosure.

Hardmask layer 148 may be formed from any one, or combination, of a wide range of suitable hardmask materials, such as titanium nitride (TiN), silicon nitride ($Si_3N_4$), silicon dioxide ($SiO_2$), silicon carbonitride (SiCN), and silicon oxynitride ($SiO_xN_y$), among others. Hardmask layer 148 may be formed via any suitable standard, custom, or proprietary formation technique(s), as will be apparent in light of this disclosure. In accordance with some embodiments, hardmask layer 148 may be formed via any one, or combination, of a PVD process, such as a sputter deposition process, and a CVD process, among others. Furthermore, the thickness (e.g., y-thickness in the y-direction) of hardmask layer 148 may be customized, as desired for a given target application or end-use. Hardmask layer 148 may be formed with any of the example dimensions discussed above, for instance, with respect to electrically conductive layer 146, in accordance with some embodiments. In some cases, hardmask layer 148 may have a substantially uniform thickness over an underlying topography. In some instances, hardmask layer 148 may be provided as a substantially conformal layer over such topography. In other instances, hardmask layer 148 may be provided with a non-uniform or otherwise varying thickness over such topography. For example, in some cases a first portion of hardmask layer 148 may have a thickness within a first range, whereas a second portion thereof may have a thickness within a second, different range. In some instances, hardmask layer 148 may have first and second portions having average thicknesses that are different from one another by about 20% or less, about 15% or less, about 10% or less, or about 5% or less. Other suitable configurations and formation techniques for hardmask layer 148 will depend on a given application and will be apparent in light of this disclosure.

Figure 15:
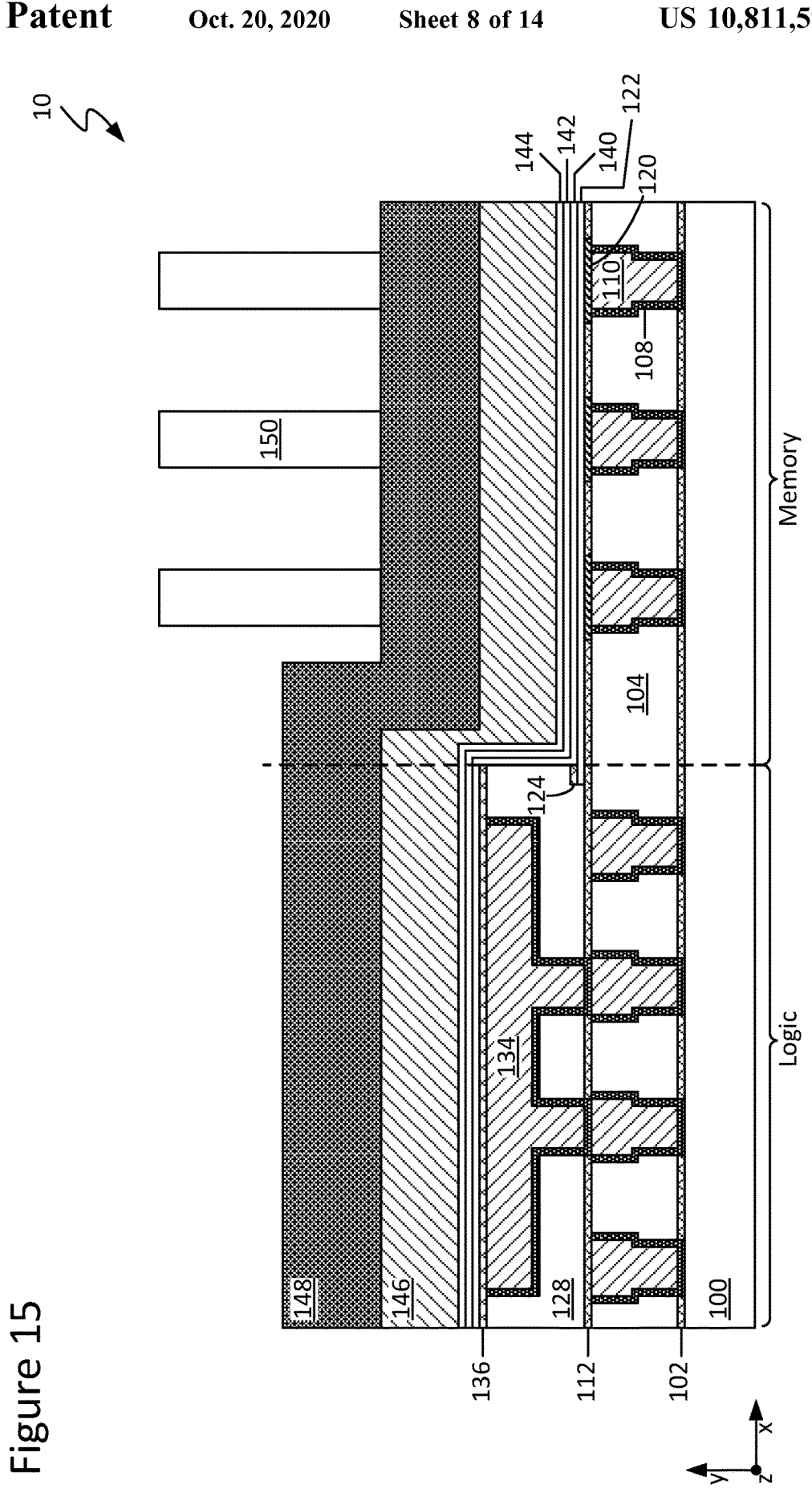
FIG. 15 illustrates a cross-sectional view of the IC of FIG. 14 after forming and patterning a resist layer, in accordance with an embodiment of the present disclosure.

The process may continue as in FIG. 15, which illustrates a cross-sectional view of IC 10 of FIG. 14 after forming and patterning a resist layer 150, in accordance with an embodiment of the present disclosure. As generally shown in FIG. 15, resist layer 150 may be formed over IC 10 and patterned so as to reside primarily over the memory side of IC 10. A given portion of patterned resist layer 150 may align with a portion of the memory side of IC 10 where an MTJ device is desired to be formed, in accordance with some embodiments. Resist layer 150 may be formed with any of the example materials, techniques, and dimensions discussed above, for instance, with respect to resist layer 114, in accordance with some embodiments. Furthermore, in some cases, an underlying hardmask material optionally may be present beneath resist layer 150 to aid in transferring the pattern of resist layer 150 to underlying hardmask layer 148, as described below with respect to FIG. 16. Other suitable configurations and formation techniques for resist layer 150 will depend on a given application and will be apparent in light of this disclosure.

The process may continue as in FIG. 16, which illustrates a cross-sectional view of IC 10 of FIG. 15 after partially removing hardmask layer 148, in accordance with an embodiment of the present disclosure. As generally shown in FIG. 16, portion(s) of hardmask layer 148 may be removed by utilizing patterned resist layer 150 as a mask and etching through hardmask layer 148. To that end, any of the example techniques discussed above, for instance, with respect to partially removing electrically conductive layer 122 and dielectric layer 124 may be used, in accordance with some embodiments. In partially removing hardmask layer 148, the surface of underlying electrically conductive layer 146 may be exposed. Any remainder of resist layer 150 and any remaining etch polymer or residue may be removed from IC 10 via any of the example techniques discussed above, for instance, with respect to resist layer 114, in accordance with some embodiments. Other suitable configurations and techniques for partially removing hardmask layer 148 will depend on a given application and will be apparent in light of this disclosure.

The process may continue as in FIG. 17, which illustrates a cross-sectional view of IC 10 of FIG. 16 after partially removing electrically conductive layer 146, upper MTJ layer(s) 144, tunnel barrier layer 142, and lower MTJ layer(s) 140, in accordance with an embodiment of the present disclosure. As generally shown in FIG. 17, portion(s) of electrically conductive layer 146, upper MTJ layer(s) 144, tunnel barrier layer 142, and lower MTJ layer(s) 140 may be removed by utilizing patterned hardmask layer 148 as a mask and etching through electrically conductive layer 146, upper MTJ layer(s) 144, tunnel barrier layer 142, and lower MTJ layer(s) 140. To that end, any of the example techniques discussed above, for instance, with respect to partially removing electrically conductive layer 122 and dielectric layer 124 may be used, in accordance with some embodiments. In partially removing electrically conductive layer 146, upper MTJ layer(s) 144, tunnel barrier layer 142, and lower MTJ layer(s) 140, the surface of underlying electrically conductive layer 122 may be exposed. In accordance with some embodiments, partial removal of electrically conductive layer 146 may serve to pattern one or more electrically conductive contacts over upper MTJ layer(s) 144, as generally shown in FIG. 17. Hardmask layer 148 may be completely consumed during etching, in accordance with an embodiment. Other suitable configurations and techniques for partially removing electrically conductive layer 146, upper MTJ layer(s) 144, tunnel barrier layer 142, and lower MTJ layer(s) 140 will depend on a given application and will be apparent in light of this disclosure.

The process may continue as in FIG. 18, which illustrates a cross-sectional view of IC 10 of FIG. 17 after forming a dielectric layer 152, in accordance with an embodiment of the present disclosure. Dielectric layer 152 may be formed with any of the example materials, techniques, and dimensions discussed above, for instance, with respect to dielectric layer 102, in accordance with some embodiments. In some cases, dielectric layer 152 may have a substantially uniform thickness (e.g., x-thickness in the x-direction and/or y-thickness in the y-direction) over an underlying topography. In some instances, dielectric layer 152 may be provided as a substantially conformal layer over such topography. In other instances, dielectric layer 152 may be provided with a non-uniform or otherwise varying thickness over such topography. For example, in some cases a first portion of dielectric layer 152 may have a thickness within a first range, whereas a second portion thereof may have a thickness within a second, different range. In some instances, dielectric layer 152 may have first and second portions having average thicknesses that are different from one another by about 20% or less, about 15% or less, about 10% or less, or about 5% or less. In some cases, dielectric layer 152 may be configured to serve, at least in part, as an etch stop layer for IC 10. Other suitable configurations and formation techniques for dielectric layer 152 will depend on a given application and will be apparent in light of this disclosure.

The process may continue as in FIG. 19, which illustrates a cross-sectional view of IC 10 of FIG. 18 after partially removing dielectric layer 152, in accordance with an embodiment of the present disclosure. As generally shown in FIG. 19, portion(s) of dielectric layer 152 may be removed by utilizing an anisotropic dry etch process to preferentially remove dielectric layer 152 from horizontal surfaces of IC 10. To that end, in accordance with some embodiments, any one, or combination, of suitable dry etch processes can be used, the etch chemistry of which may be customized, as desired for a given target application or end-use. In partially removing dielectric layer 152, the surfaces of underlying electrically conductive layers 146 and 122, among others, may be exposed. The resultant dielectric layer 152 may be configured to extend from the surface of electrically conductive layer 122 along the sidewalls of lower MTJ layer(s) 140, tunnel barrier layer 142, upper MTJ layer(s) 144, and electrically conductive layer 146, serving as a first spacer layer for those layers 140, 142, 144, and 146, in accordance with some embodiments. In some cases, dielectric layer 152 may be configured to serve, at least in part, to protect the sidewalls of tunnel barrier layer 142 and MTJ layer(s) 140 and 144 from oxidation and corrosion. Other suitable configurations and techniques for partially removing dielectric layer 152 (e.g., spacer layer 152) will depend on a given application and will be apparent in light of this disclosure.

In some cases, an additional resist layer (e.g., photomask) may be applied to IC 10 after dielectric layer 152 is patterned into sidewall spacers for the MTJ stack. This additional resist layer may facilitate partial removal of electrically conductive layer 122, discussed below with reference to FIG. 20. After partial removal of electrically conductive layer 122, this additional resist may be removed, for example, via an ash process or other suitable process, and then dielectric layer 154, discussed below with respect to FIG. 21, may be formed over IC 10, in accordance with an embodiment.

Figure 20:
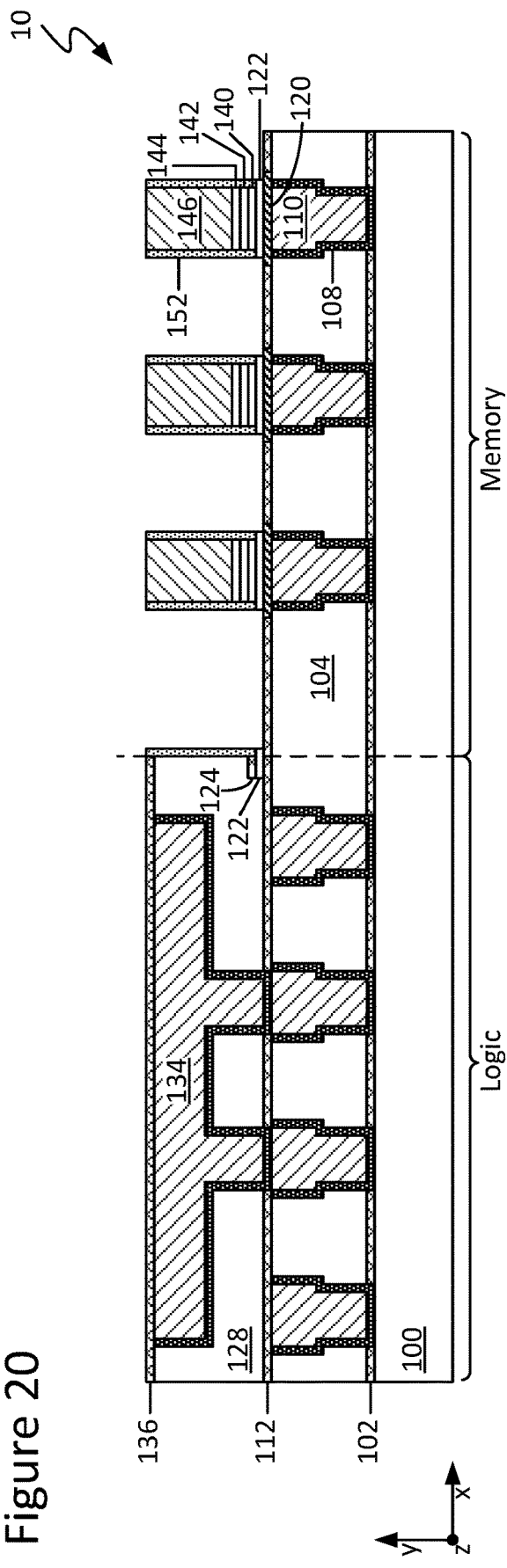
FIG. 20 illustrates a cross-sectional view of the IC of FIG. 19 after partially removing an electrically conductive layer, in accordance with an embodiment of the present disclosure.

The process may continue as in FIG. 20, which illustrates a cross-sectional view of IC 10 of FIG. 19 after partially removing electrically conductive layer 122, in accordance with an embodiment of the present disclosure. As generally shown in FIG. 20, portion(s) of electrically conductive layer 122 may be removed by utilizing dielectric layer 152 and electrically conductive layer 146 as a mask and etching through electrically conductive layer 122. To that end, any of the example techniques discussed above, for instance, with respect to partially removing electrically conductive layer 122 and dielectric layer 124 may be used, in accordance with some embodiments. In partially removing electrically conductive layer 122, the surfaces of underlying dielectric layer 112 and electrically conductive layer 120 may be exposed. Other suitable configurations and techniques for partially removing electrically conductive layer 122 (e.g., pedestal layer 122) will depend on a given application and will be apparent in light of this disclosure.

Figure 21:
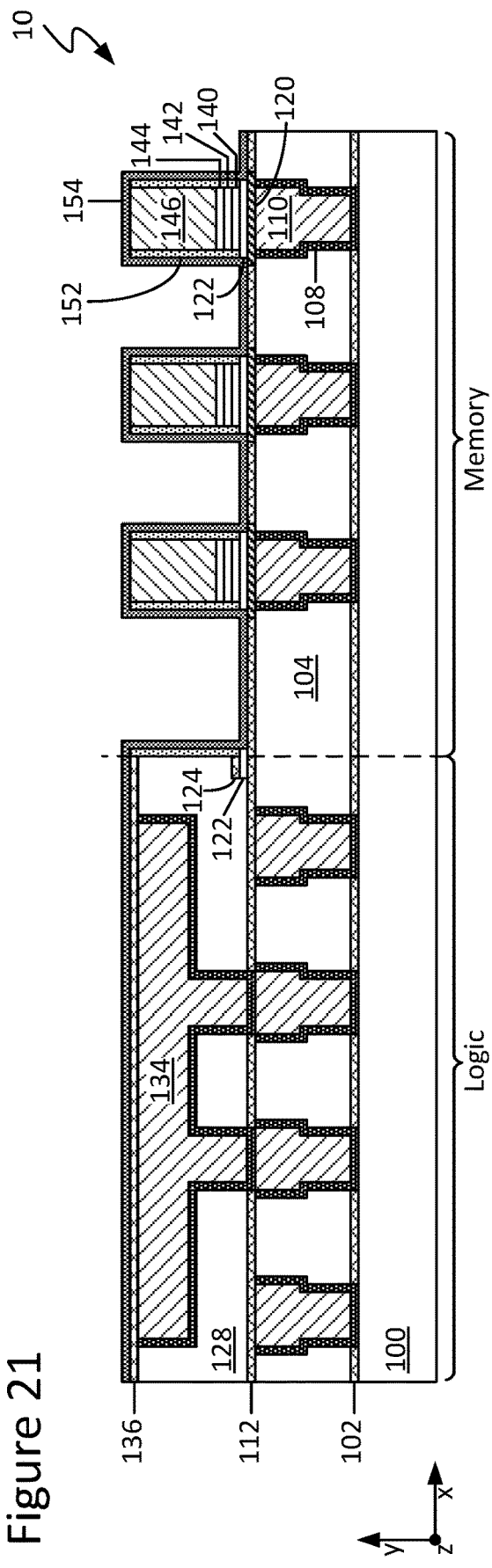
FIG. 21 illustrates a cross-sectional view of the IC of FIG. 20 after forming a dielectric layer, in accordance with an embodiment of the present disclosure.

The process may continue as in FIG. 21, which illustrates a cross-sectional view of IC 10 of FIG. 20 after forming a dielectric layer 154, in accordance with an embodiment of the present disclosure. Dielectric layer 154 may be formed with any of the example materials, techniques, and dimensions discussed above, for instance, with respect to dielectric layer 102, in accordance with some embodiments. In some cases, dielectric layer 154 may have a substantially uniform thickness (e.g., x-thickness in the x-direction and/or y-thickness in the y-direction) over an underlying topography. In some instances, dielectric layer 154 may be provided as a substantially conformal layer over such topography. In other instances, dielectric layer 154 may be provided with a non-uniform or otherwise varying thickness over such topography. For example, in some cases a first portion of dielectric layer 154 may have a thickness within a first range, whereas a second portion thereof may have a thickness within a second, different range. In some instances, dielectric layer 154 may have first and second portions having average thicknesses that are different from one another by about 20% or less, about 15% or less, about 10% or less, or about 5% or less. In some cases, dielectric layer 154 may be configured to serve, at least in part, as an etch stop layer for IC 10. Other suitable configurations and formation techniques for dielectric layer 154 will depend on a given application and will be apparent in light of this disclosure.

As will be appreciated in light of this disclosure, it may be desirable, in some instance, to perform any (or all) of the processing described with respect to FIGS. 17-21 in-situ/without air break, for example, to prevent or otherwise reduce undesired oxidation or corrosion of any of MTJ layer(s) 140 and 144, tunnel barrier layer 142, and electrically conductive layer 146. To that end, such processing may be performed, for example, in a large cluster tool without breaking vacuum, in accordance with some embodiments.

Figure 22:
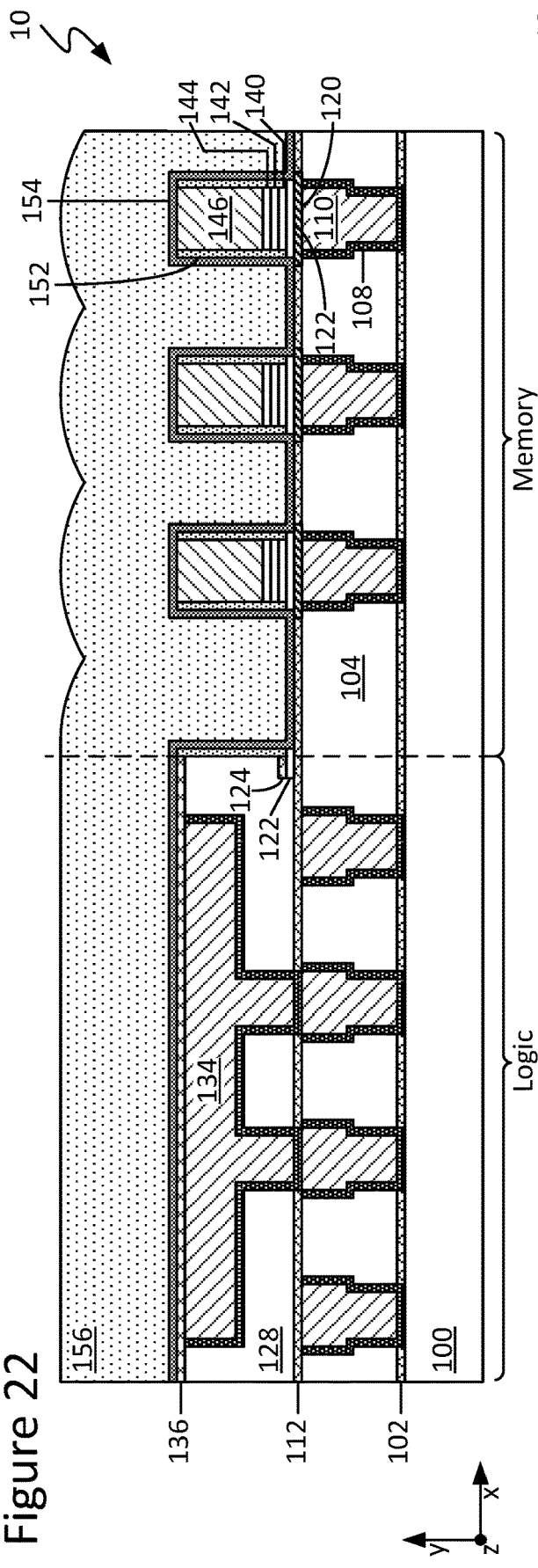
FIG. 22 illustrates a cross-sectional view of the IC of FIG. 21 after forming a dielectric layer, in accordance with an embodiment of the present disclosure.

The process may continue as in FIG. 22, which illustrates a cross-sectional view of IC 10 of FIG. 21 after forming a dielectric layer 156, in accordance with an embodiment of the present disclosure. Dielectric layer 156 may be formed with any of the example materials and techniques discussed above, for instance, with respect to dielectric layer 102, in accordance with some embodiments. In accordance with some other embodiments, dielectric layer 156 may be formed from any one, or combination, of flowable dielectric materials, which may be deposited and cured or converted in-situ over an underlying topography of IC 10. The particular individual precursor(s) and reactive gas(es), as well as their ratio(s), can be customized, as desired for a given target application or end-use. In some cases, dielectric layer 156 may be formed via any one, or combination, of suitable flowable chemical vapor deposition (FCVD) processes, such as remote plasma-enhanced CVD (RPECVD). Using such a remote plasma process may help to maintain a low processing temperature, which in turn can help, in some instances, to maintain desired fluidity/flowability of dielectric layer 156. In some cases, dielectric layer 156 may be formed from one or more standard ILD materials typically used in IC fabrication, utilizing any one, or combination, of an SOD process and a CVD process, such as PECVD.

Furthermore, the thickness (e.g., y-thickness in the y-direction) of dielectric layer 156 may be customized, as desired for a given target application or end-use. In some cases, dielectric layer 156 may have a thickness in the range of about 5 nm-1 μm (e.g., about 5-250 nm, about 250-500 nm, about 500-750 nm, about 750 nm-1 μm, or any other sub-range in the range of about 5 nm-1 μm). In some cases, dielectric layer 156 may have a substantially uniform thickness over an underlying topography. In some instances, dielectric layer 156 may be provided as a substantially conformal layer over such topography. In other instances, dielectric layer 156 may be provided with a non-uniform or otherwise varying thickness over such topography. For example, in some cases a first portion of dielectric layer 156 may have a thickness within a first range, whereas a second portion thereof may have a thickness within a second, different range. In some instances, dielectric layer 156 may have first and second portions having average thicknesses that are different from one another by about 20% or less, about 15% or less, about 10% or less, or about 5% or less. As will be appreciated in light of this disclosure, it may be desirable to flow or otherwise deposit a sufficient amount of dielectric layer 156 over IC 10 so as to provide a sufficient overburden thereof for subsequent processing (e.g., planarization, as discussed below with reference to FIG. 23). In some cases, dielectric layer 156 may be configured to serve, at least in part, as an inter-layer dielectric (ILD) for IC 10. Other suitable configurations and formation techniques for dielectric layer 156 (e.g., ILD layer 156) will depend on a given application and will be apparent in light of this disclosure.

Figure 23:
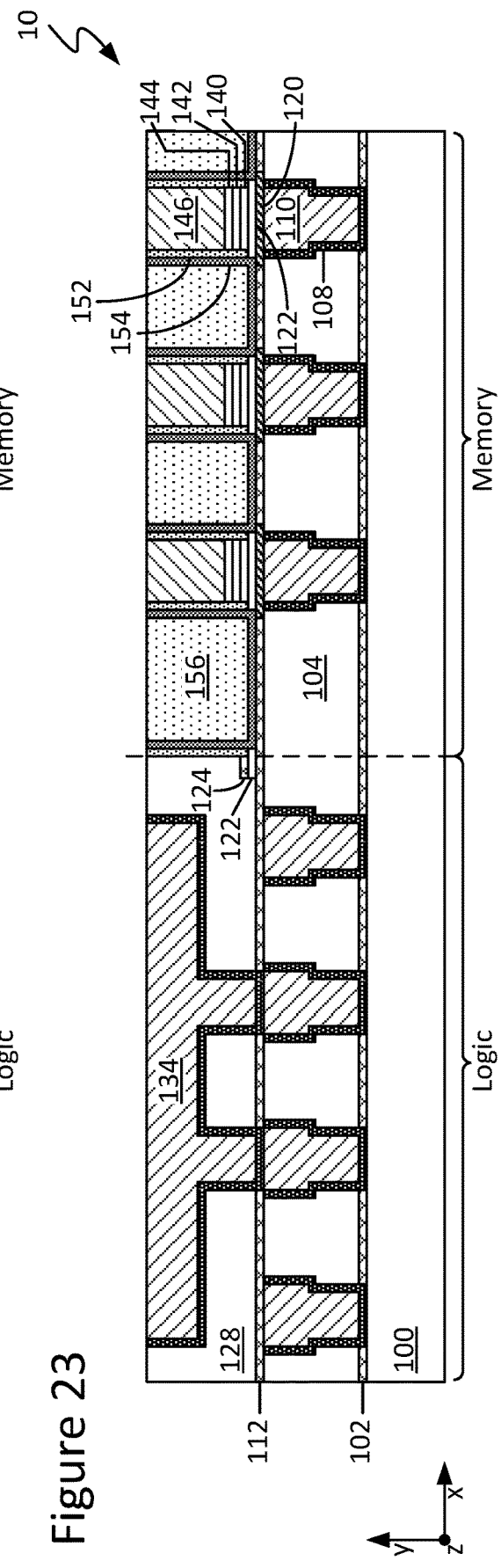
FIG. 23 illustrates a cross-sectional view of the IC of FIG. 22 after partially removing several dielectric layers and an electrically conductive layer, in accordance with an embodiment of the present disclosure.

The process may continue as in FIG. 23, which illustrates a cross-sectional view of IC 10 of FIG. 22 after partially removing dielectric layers 156, 154, 152, and 136 and electrically conductive layer 146, in accordance with an embodiment of the present disclosure. As generally shown in FIG. 23, portion(s) of dielectric layers 156, 154, 152, and 136 and electrically conductive layer 146 may be removed, for example, via a CMP process or other suitable planarization process, as will be apparent in light of this disclosure. In some instances, the CMP or other planarization process initially may stop, for example, on dielectric layer 136 (e.g., etch stop layer 136) before then proceeding with removal of that dielectric layer 136, stopping on underlying electrically conductive feature(s) 134. In partially removing dielectric layers 156, 154, 152, and 136 and electrically conductive layer 146, the surfaces of underlying electrically conductive feature(s) 134, dielectric layer 128, and electrically conductive layer 146 may be exposed. Other suitable configurations and techniques for partially removing dielectric layer 156 (e.g., ILD layer 156), dielectric layer 154 (e.g., spacer layer 154), dielectric layer (e.g., spacer layer 152), dielectric layer 136 (e.g., etch stop layer 136), and electrically conductive layer 146 (e.g., electrically conductive contact 146) will depend on a given application and will be apparent in light of this disclosure.

Figure 24:
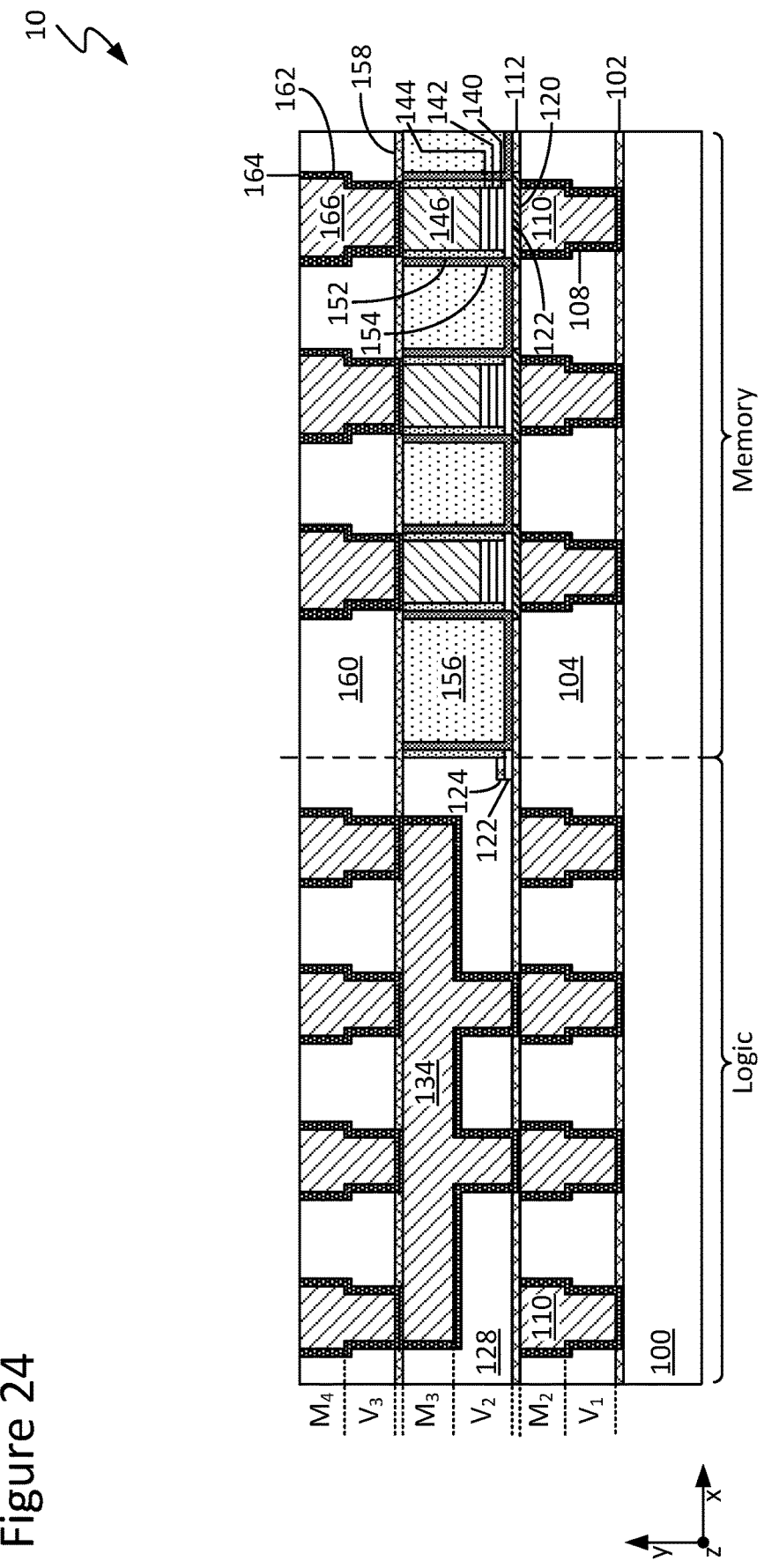
FIG. 24 illustrates a cross-sectional view of the IC of FIG. 23 after forming several dielectric layers, one or more features, one or more barrier layers within those feature(s), and one or more electrically conductive features within those feature(s), in accordance with an embodiment of the present disclosure.

The process may continue as in FIG. 24, which illustrates a cross-sectional view of IC 10 of FIG. 23 after forming a dielectric layer 158, a dielectric layer 160, one or more features 162, one or more barrier layers 164 within those feature(s) 162, and one or more electrically conductive features 166 within those feature(s) 162, in accordance with an embodiment of the present disclosure. Dielectric layer 158 may be formed with any of the example materials, techniques, and dimensions discussed above, for instance, with respect to dielectric layer 102, in accordance with some embodiments. Dielectric layer 160 may be formed with any of the example materials, techniques, and dimensions discussed above, for instance, with respect to dielectric layer 104, in accordance with some embodiments. Feature(s) 162 may be formed in dielectric layer 160 with any of the example techniques, dimensions, and geometries discussed above, for instance, with respect to feature(s) 106, in accordance with some embodiments. Barrier layer(s) 164 may be formed over the topography provided by a given feature 162 with any of the example materials, techniques, and dimensions discussed above, for instance, with respect to barrier layer(s) 108, in accordance with some embodiments. Electrically conductive feature(s) 166 may be formed within a given feature 162 with any of the example materials, techniques, dimensions, and geometries discussed above, for instance, with respect to electrically conductive feature(s) 110, in accordance with some embodiments. Other suitable configurations and formation techniques for dielectric layer 158 (e.g., etch stop layer 158), dielectric layer 160, feature(s) 162, barrier layer(s) 164, and electrically conductive feature(s) 166 will depend on a given application and will be apparent in light of this disclosure. Additional interconnect layer(s) including one or more dielectric layers and one or more electrically conductive features may be formed over IC 10, as desired, utilizing any of the various materials, techniques, and dimensions described herein, in accordance with some embodiments.

As generally shown in FIGS. 1-24, the disclosed techniques may be employed, for example, in forming one or more MTJ devices over a back-end-of-line (BEOL) interconnect layer 2 (generally referred to as a Metal2 or M2 layer) of a host IC 10, in accordance with some embodiments. More specifically, as shown, one or more MTJ devices may be embedded into or otherwise disposed, in part or in whole, within a BEOL Metal3 (M3) layer of a host IC, in accordance with an embodiment. It should be noted, however, that the present disclosure is not intended to be so limited, as in a more general sense, and in accordance with some other embodiments, the disclosed techniques can be employed, for example, in forming one or more MTJ devices within or over any desired BEOL interconnect layer (e.g., Metal1 or M1, Metal3 or M3, Metal4 or M4, and beyond) of a host IC 10. That is, one or more MTJ devices may be embedded into or otherwise disposed, in part or in whole, within a BEOL Metal1 (M1), Metal2 (M2), Metal4 (M4), or other interconnect layer of a host IC, in accordance with some other embodiments. Furthermore, one or more back-end layers or front-end layers (or both) may be disposed between semiconductor substrate 100 and a given patterned BEOL interconnect layer disposed there over, in accordance with some embodiments. Numerous suitable configurations and variations will be apparent in light of this disclosure.

Example System

Figure 25:
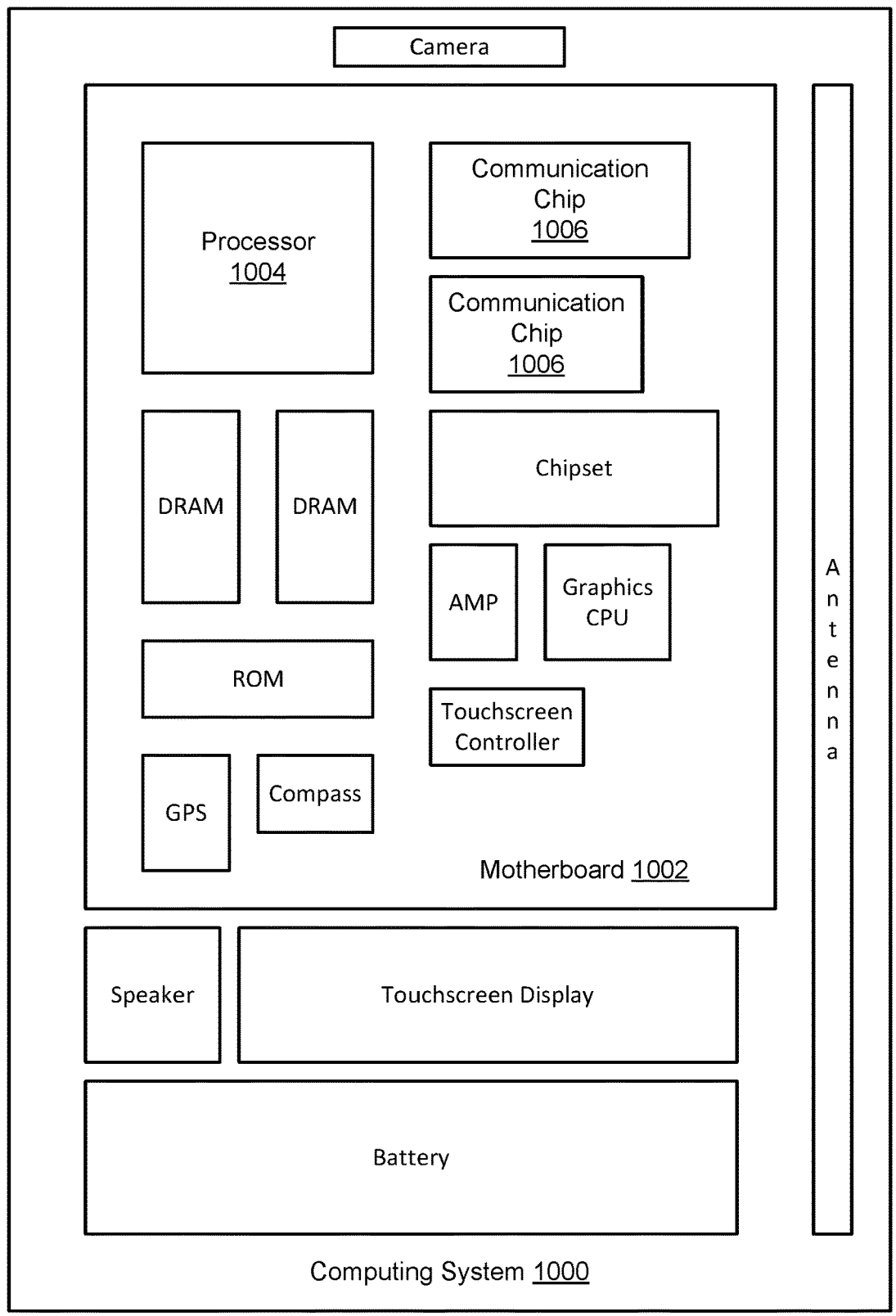
FIG. 25 illustrates a computing system implemented with integrated circuit structures or devices formed using the disclosed techniques in accordance with an example embodiment.

FIG. 25 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a semiconductor substrate; a logic device disposed over the semiconductor substrate, the logic device including one or more interconnect layers; and a memory device disposed within at least one of the one or more interconnect layers of the logic device, the memory device including: a first magnetic layer; an insulator layer disposed over the first magnetic layer; and a second magnetic layer disposed over the insulator layer.

Example 2 includes the subject matter of any of Examples 1 and 3-19 and further includes a first electrically conductive layer disposed under the first magnetic layer and configured for electronic coupling therewith.

Example 3 includes the subject matter of Example 2, wherein the first electrically conductive layer: includes at least one of titanium, tantalum, ruthenium, cobalt, tungsten, tantalum nitride, titanium nitride, and titanium zirconium nitride; and has a y-thickness in the range of about 1-50 nm.

Example 4 includes the subject matter of Example 2 and further includes a second electrically conductive layer disposed under the first electrically conductive layer and configured for electronic coupling therewith.

Example 5 includes the subject matter of Example 4, wherein the second electrically conductive layer and the first electrically conductive layer are of different material composition.

Example 6 includes the subject matter of Example 4, wherein the second electrically conductive layer: includes at least one of titanium, tantalum, ruthenium, cobalt, tungsten, tantalum nitride, titanium nitride, and titanium zirconium nitride; and has a y-thickness in the range of about 1-50 nm.

Example 7 includes the subject matter of any of Examples 1-6 and 8-19 and further includes a first spacer layer disposed over the first electrically conductive layer, extending along sidewalls of each of the first magnetic layer, the insulator layer, and the second magnetic layer.

Example 8 includes the subject matter of Example 7, wherein the first spacer layer: includes at least one of silicon dioxide, silicon nitride, silicon carbide, silicon oxynitride, and carbon-doped silicon oxynitride; and has at least one of an x-thickness and a y-thickness in the range of about 1-50 nm.

Example 9 includes the subject matter of Example 7 and further includes a second spacer layer disposed along sidewalls of the first electrically conductive layer and the first spacer layer.

Example 10 includes the subject matter of Example 9, wherein the first spacer layer and the second spacer layer are of different material composition.

Example 11 includes the subject matter of Example 9, wherein the second spacer layer: includes at least one of silicon dioxide, silicon nitride, silicon carbide, silicon oxynitride, and carbon-doped silicon oxynitride; and has at least one of an x-thickness and a y-thickness in the range of about 1-50 nm.

Example 12 includes the subject matter of any of Examples 1-11 and 13-19 and further includes an electrically conductive contact disposed over the second magnetic layer and configured for electronic coupling therewith.

Example 13 includes the subject matter of Example 12, wherein the electrically conductive contact: includes at least one of titanium, tantalum, ruthenium, cobalt, tungsten, tantalum nitride, titanium nitride, and titanium zirconium nitride; and has a y-thickness in the range of about 1 nm-1 μm.

Example 14 includes the subject matter of any of Examples 1-13 and 15-19, wherein: the first magnetic layer is either a fixed magnetic layer or a free magnetic layer; and the second magnetic layer is the other of either a fixed magnetic layer or a free magnetic layer.

Example 15 includes the subject matter of any of Examples 1-14 and 16-19, wherein at least one of the first magnetic layer and the second magnetic layer: includes at least one of iron, tantalum, ruthenium, cobalt, a cobalt-palladium alloy, a cobalt-platinum alloy, and a cobalt-iron-boron alloy; and has a y-thickness in the range of about 1-50 nm.

Example 16 includes the subject matter of any of Examples 1-15 and 17-19, wherein the insulator layer: includes at least one of magnesium oxide and aluminum oxide; and has a y-thickness in the range of about 0.1-15 nm.

Example 17 includes the subject matter of any of Examples 1-16 and 18-19, wherein: at least one of the one or more interconnect layers of the logic device includes: a first dielectric layer; and an electrically conductive feature disposed within the first dielectric layer; and the integrated circuit further includes a second dielectric layer disposed within the at least one of the one or more interconnect layers of the logic device, wherein the memory device is disposed within the second dielectric layer.

Example 18 includes the subject matter of Example 17, wherein: the first dielectric layer includes at least one of silicon dioxide, carbon-doped oxide, silicon nitride, silicon carbide, silicon oxynitride, carbon-doped silicon oxynitride fluorinated silicon oxide, and borophosphosilicate glass; and the second dielectric layer: includes at least one of silicon dioxide, carbon-doped oxide, silicon nitride, silicon carbide, silicon oxynitride, and carbon-doped silicon oxynitride; and has a y-thickness in the range of about 5 nm-1 μm.

Example 19 includes the subject matter of Example 17, wherein the second dielectric layer and the first dielectric layer are of different material composition.

Example 20 is an integrated circuit including: a semiconductor substrate; a logic device disposed over a first portion of the semiconductor substrate, the logic device including: a first dielectric layer; and an electrically conductive feature disposed within the first dielectric layer; and a memory device disposed over a second portion of the semiconductor substrate, the second portion laterally adjacent to the first portion, the memory device including: a second dielectric layer; and a magnetic tunnel junction (MTJ) device disposed within the second dielectric layer, the MTJ device including: a first magnetic layer; an insulator layer disposed over the first magnetic layer; and a second magnetic layer disposed over the insulator layer.

Example 21 includes the subject matter of any of Examples 20 and 22-32 and further includes a titanium nitride layer disposed under the first magnetic layer and configured for electronic coupling therewith, wherein the titanium nitride layer has a y-thickness in the range of about 1-50 nm.

Example 22 includes the subject matter of Example 21 and further includes a tantalum nitride layer disposed under the titanium nitride layer and configured for electronic coupling therewith, wherein the tantalum nitride layer has a y-thickness in the range of about 1-50 nm.

Example 23 includes the subject matter of Example 21 and further includes a first spacer layer disposed over the titanium nitride layer, extending along sidewalls of each of the first magnetic layer, the insulator layer, and the second magnetic layer.

Example 24 includes the subject matter of Example 23, wherein the first spacer layer: includes at least one of silicon dioxide, silicon nitride, silicon carbide, silicon oxynitride, and carbon-doped silicon oxynitride; and has at least one of an x-thickness and a y-thickness in the range of about 1-50 nm.

Example 25 includes the subject matter of Example 23 and further includes a second spacer layer disposed along sidewalls of the titanium nitride layer and the first spacer layer.

Example 26 includes the subject matter of Example 25, wherein the first spacer layer and the second spacer layer are of different material composition.

Example 27 includes the subject matter of Example 25, wherein the second spacer layer: includes silicon nitride; and has at least one of an x-thickness and a y-thickness in the range of about 1-50 nm.

Example 28 includes the subject matter of any of Examples 20-27 and 29-32 and further includes an electrode disposed over the second magnetic layer and configured for electronic coupling therewith, wherein the electrode includes at least one of titanium, tantalum, ruthenium, cobalt, tungsten, tantalum nitride, titanium nitride, and titanium zirconium nitride.

Example 29 includes the subject matter of any of Examples 20-28 and 30-32, wherein: the first magnetic layer is either a fixed magnetic layer or a free magnetic layer; and the second magnetic layer is the other of either a fixed magnetic layer or a free magnetic layer.

Example 30 includes the subject matter of any of Examples 20-29 and 31-32, wherein at least one of the first magnetic layer and the second magnetic layer: includes at least one of iron, tantalum, ruthenium, cobalt, a cobalt-palladium alloy, a cobalt-platinum alloy, and a cobalt-iron-boron alloy; and has a y-thickness in the range of about 1-50 nm.

Example 31 includes the subject matter of any of Examples 20-30 and 32, wherein the insulator layer: includes at least one of magnesium oxide and aluminum oxide; and has a y-thickness in the range of about 0.1-15 nm.

Example 32 includes the subject matter of any of Examples 20-31, wherein: the first dielectric layer includes a carbon-doped oxide; and the second dielectric layer includes at least one of silicon dioxide, silicon nitride, silicon carbide, silicon oxynitride, and carbon-doped silicon oxynitride.

Example 33 is a method of fabricating an integrated circuit, the method including: forming a logic device over a semiconductor substrate, the logic device including one or more interconnect layers; forming a memory device within at least one of the one or more interconnect layers of the logic device, the memory device including: a first magnetic layer; an insulator layer disposed over the first magnetic layer; and a second magnetic layer disposed over the insulator layer.

Example 34 includes the subject matter of any of Examples 33 and 35-44 and further includes forming a first electrically conductive layer under the first magnetic layer and configured for electronic coupling therewith.

Example 35 includes the subject matter of Example 34 and further includes forming a second electrically conductive layer under the first electrically conductive layer and configured for electronic coupling therewith.

Example 36 includes the subject matter of Example 35, wherein the second electrically conductive layer and the first electrically conductive layer are of different material composition.

Example 37 includes the subject matter of Example 34 and further includes forming a first spacer layer over the first electrically conductive layer, the first spacer layer extending along sidewalls of each of the first magnetic layer, the insulator layer, and the second magnetic layer.

Example 38 includes the subject matter of Example 37 and further includes forming a second spacer layer along sidewalls of the first electrically conductive layer and the first spacer layer.

Example 39 includes the subject matter of Example 38, wherein the second spacer layer and the first spacer layer are of different material composition.

Example 40 includes the subject matter of any of Examples 33-39 and 41-44 and further includes forming an electrically conductive contact over the second magnetic layer and configured for electronic coupling therewith.

Example 41 includes the subject matter of any of Examples 33-40 and 42-44, wherein: at least one of the one or more interconnect layers of the logic device includes: a first dielectric layer; and an electrically conductive feature disposed within the first dielectric layer; and the method further includes: forming a second dielectric layer within the at least one of the one or more interconnect layers of the logic device, wherein the memory device is disposed within the second dielectric layer.

Example 42 includes the subject matter of Example 41, wherein the second dielectric layer and the first dielectric layer are of different material composition.

Example 43 includes the subject matter of Example 41, wherein forming the second dielectric layer involves at least one of a physical vapor deposition (PVD) process, a spin-on deposition (SOD) process, a chemical vapor deposition (CVD) process.

Example 44 includes the subject matter of Example 41, wherein forming the second dielectric layer involves a flowable chemical vapor deposition (FCVD) process.

Example 45 is a method of fabricating a logic processing unit, the method including: forming a plurality of back-end-of-line (BEOL) interconnect layers over a semiconductor substrate; and forming a memory device embedded within at least one of the BEOL interconnect layers, the memory device including: a magnetic tunnel junction (MTJ) device including: a fixed magnetic layer; a free magnetic layer; and a tunnel barrier layer disposed between the fixed magnetic layer and the free magnetic layer; an electrically conductive via disposed under the MTJ device and configured for electronic coupling therewith; and an electrically conductive contact disposed over the MTJ device and configured for electronic coupling therewith.

Example 46 includes the subject matter of any of Examples 45 and 47-53 and further includes forming an electrically conductive layer under the MTJ device and configured for electronic coupling therewith, wherein the electrically conductive layer is disposed between the electrically conductive via and the MTJ device.

Example 47 includes the subject matter of Example 46, wherein the electrically conductive layer and the electrically conductive via are of different material composition.

Example 48 includes the subject matter of Example 46 and further includes: forming a first conformal spacer layer along sidewalls of the MTJ device; and forming a second conformal spacer layer along sidewalls of the electrically conductive layer and the first conformal spacer layer.

Example 49 includes the subject matter of Example 48, wherein the second conformal spacer layer and the first conformal spacer layer are of different material composition.

Example 50 includes the subject matter of Example 48 and further includes forming a dielectric layer over the second conformal spacer layer, adjacent the MTJ device.

Example 51 includes the subject matter of Example 50, wherein forming the dielectric layer involves at least one of a physical vapor deposition (PVD) process, a spin-on deposition (SOD) process, a chemical vapor deposition (CVD) process.

Example 52 includes the subject matter of Example 50, wherein forming the dielectric layer involves a flowable chemical vapor deposition (FCVD) process.

Example 53 includes the subject matter of any of Examples 45-52, wherein the memory device is configured as spin-transfer torque magnetoresistive random-access memory (STT-MRAM).

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
a semiconductor substrate; a logic device over the semiconductor substrate, the logic device comprising one or more interconnect layers; and a memory device within at least one of the one or more interconnect layers of the logic device, the memory device including a first magnetic layer, an insulator layer over the first magnetic layer,
a second magnetic layer over the insulator layer, a first electrically conductive layer under the first magnetic layer, a second electrically conductive layer under the first electrically conductive layer, wherein a width of the second electrically conductive layer is greater than a width of the first electrically conductive layer, a first dielectric spacer over the first electrically conductive layer, and a second dielectric spacer directly on sidewalls of the first electrically conductive layer and the first spacer; wherein the first spacer is between the second spacer and at least one of the first magnetic layer, the insulator layer, and the second magnetic layer, and wherein the second electrically conductive layer is over an electrically conductive feature of the one or more interconnect layers.

2. The integrated circuit of claim 1, wherein the first electrically conductive layer:
comprises one or more of titanium, tantalum, ruthenium, cobalt, tungsten, tantalum and nitrogen, titanium and nitrogen, and titanium zirconium and nitrogen; and
has a thickness in the range of about 1-50 nm.

3. The integrated circuit of claim 2, wherein the second electrically conductive layer:
comprises one or more of titanium, tantalum, ruthenium, cobalt, tungsten, tantalum nitride, titanium and nitrogen, and titanium zirconium and nitrogen; and
has a thickness in the range of about 1-50 nm.

4. The integrated circuit of claim 1, wherein the first spacer extends along sidewalls of each of the first magnetic layer, the insulator layer, and the second magnetic layer, wherein the first spacer:
comprises silicon and one or more of oxygen, nitrogen, and carbon; and
has a thickness measured from a surface of each of the sidewalls in the range of about 1-50 nm.

5. The integrated circuit of claim 4, wherein the second spacer:
comprises silicon and one or more of oxygen, nitrogen, and carbon; and
has a thickness measured from a surface of each of the sidewalls of the first electrically conductive layer and the first spacer in the range of about 1-50 nm.

6. The integrated circuit of claim 1, further comprising an electrically conductive contact over the second magnetic layer, wherein the electrically conductive contact:
comprises one or more of titanium, tantalum, ruthenium, cobalt, tungsten, tantalum and nitrogen, titanium and nitrogen, and titanium zirconium and nitrogen; and
has a thickness in the range of about 1 nm-1 µm.

7. The integrated circuit of claim 1, wherein at least one of the one or more interconnect layers of the logic device includes a first dielectric layer and an electrically conductive feature within the first dielectric layer, the integrated circuit further comprising a second dielectric layer within the at least one of the one or more interconnect layers of the logic device, wherein the memory device is within the second dielectric layer.

8. The integrated circuit of claim 7, wherein:
the first dielectric layer comprises one or more of silicon dioxide, carbon-doped oxide, silicon nitride, silicon carbide, silicon oxynitride, carbon-doped silicon oxynitride fluorinated silicon oxide, and borophosphosilicate glass; and
the second dielectric layer:
comprises one or more of silicon dioxide, carbon-doped oxide, silicon nitride, silicon carbide, silicon oxynitride, and carbon-doped silicon oxynitride; and
has a thickness in the range of about 5 nm-1 µm.

9. An integrated circuit comprising: a semiconductor substrate;
a logic device over a first portion of the semiconductor substrate, the logic device comprising: a first dielectric layer; and an electrically conductive feature within the first dielectric layer; and a memory device over a second portion of the semiconductor substrate, the second portion laterally adjacent to the first portion, the memory device comprising: a second dielectric layer; a magnetic tunnel junction (MTJ) device within the second dielectric layer, the MTJ device comprising: a first magnetic layer;
an insulator layer over the first magnetic layer; and a second magnetic layer over the insulator layer; a first electrically conductive layer under the first magnetic layer;
a second electrically conductive layer under the first electrically conductive layer, wherein a width of the second electrically conductive layer is greater than a width of the first electrically conductive layer; a first dielectric spacer over the first electrically conductive layer; and a second dielectric spacer directly on sidewalls of the first electrically conductive layer and the first spacer; wherein the first spacer is between the second spacer and at least one of the first magnetic layer, the insulator layer, and the second magnetic layer, and wherein the second electrically conductive layer is over an electrically conductive feature over the second portion of the semiconductor substrate.

10. The integrated circuit of claim 9,
wherein the first electrically conductive layer is a titanium nitride layer having a thickness in the range of about 1-50 nm; and
wherein the second electrically conductive layer is a tantalum nitride layer having a thickness in the range of about 1-50 nm.

11. The integrated circuit of claim 9, wherein the first spacer extends along sidewalls of each of the first magnetic layer, the insulator layer, and the second magnetic layer, wherein the first spacer:
comprises one or more of silicon dioxide, silicon nitride, silicon carbide, silicon oxynitride, and carbon-doped silicon oxynitride; and
has a thickness measured from a surface of each of the sidewalls in the range of about 1-50 nm; and
wherein the second spacer:
comprises silicon nitride; and
has a thickness measured from a surface of each of the sidewalls of the first electrically conductive layer and the first spacer in the range of about 1-50 nm.

12. The integrated circuit of claim 9, wherein:
the first dielectric layer comprises a carbon-doped oxide; and
the second dielectric layer comprises one or more of silicon dioxide, silicon nitride, silicon carbide, silicon oxynitride, and carbon-doped silicon oxynitride.

13. A method of fabricating an integrated circuit, the method comprising: forming a logic device over a semiconductor substrate, the logic device comprising one or more interconnect layers; and forming a memory device within at least one of the one or more interconnect layers of the logic device, the memory device comprising: a first magnetic layer, an insulator layer over the first magnetic layer, a second magnetic layer over the insulator layer, a first electrically conductive layer under the first magnetic layer, a second electrically conductive layer under the first electrically conductive layer, wherein a width of the second electrically conductive layer is greater than a width of the first electrically conductive layer, a first dielectric spacer over the first electrically conductive layer, and a second dielectric spacer directly on sidewalls of the first electrically conductive layer and the first spacer, wherein the first spacer is between the second spacer and at least one of the first magnetic layer, the insulator layer, and the second magnetic layer, and wherein the second electrically conductive layer is over an electrically conductive feature of the one or more interconnect layers.

14. The method of claim 13, further comprising:
forming the first spacer extending along sidewalls of each of the first magnetic layer, the insulator layer, and the second magnetic layer.

15. The method of claim 13, further comprising:
forming an electrically conductive contact over the second magnetic layer.

16. The method of claim 13, wherein at least one of the one or more interconnect layers of the logic device includes a first dielectric layer, and an electrically conductive feature within the first dielectric layer, the method further comprising:
forming a second dielectric layer within the at least one of the one or more interconnect layers of the logic device, wherein the memory device is within the second dielectric layer.

17. The method of claim 16, wherein forming the second dielectric layer involves at least one of a physical vapor deposition (PVD) process, a spin-on deposition (SOD) process, a chemical vapor deposition (CVD) process, or a flowable chemical vapor deposition (FCVD) process.

18. A method of fabricating a logic processing unit, the method comprising: forming a plurality of back-end-of-line (BEOL) interconnect layers over a semiconductor substrate; and forming a memory device embedded within at least one of the BEOL interconnect layers, the memory device comprising: a magnetic tunnel junction (MTJ) device comprising: a fixed magnetic layer; a free magnetic layer; and a tunnel barrier layer between the fixed magnetic layer and the free magnetic layer; a first electrically conductive layer under the MTJ device; a second electrically conductive layer under the first electrically conductive layer, wherein a width of the second electrically conductive layer is greater than a width of the first electrically conductive layer; a first dielectric spacer over the first electrically conductive layer; a second dielectric spacer directly on sidewalls of the first electrically conductive layer and the first spacer, wherein the first spacer is between the second spacer and at least one of the fixed magnetic layer, the tunnel barrier layer, and the free magnetic layer; an electrically conductive via within at least one of the BEOL interconnect layers under the second electrically conductive layer; and an electrically conductive contact over the MTJ device.

19. The method of claim 18, further comprising:
forming the first spacer along sidewalls of the MTJ device.

20. The method of claim 19, further comprising:
forming a dielectric layer over the second spacer, adjacent the MTJ device, wherein forming the dielectric layer involves at least one of a physical vapor deposition (PVD) process, a spin-on deposition (SOD) process, a chemical vapor deposition (CVD) process, or a flowable chemical vapor deposition (FCVD) process.

21. The method of claim 18, wherein the memory device is configured as spin-transfer torque magnetoresistive random-access memory (STT-MRAM).

\* \* \* \* \*